United States Patent [19]
Hampden-Smith et al.

[11] Patent Number: 5,837,320
[45] Date of Patent: Nov. 17, 1998

[54] CHEMICAL VAPOR DEPOSITION OF METAL SULFIDE FILMS FROM METAL THIOCARBOXYLATE COMPLEXES WITH MONODENATE OR MULTIDENTATE LIGANDS

[75] Inventors: Mark Hampden-Smith; Klaus Kunze; May Nyman, all of Albuquerque, N. Mex.

[73] Assignee: The University of New Mexico, Albuquerque, N. Mex.

[21] Appl. No.: 607,390

[22] Filed: Feb. 27, 1996

[51] Int. Cl.$^6$ ............... C23C 16/00; B05D 5/12
[52] U.S. Cl. ............. 427/248.1; 427/69; 427/255; 427/255.1; 427/255.2; 427/314; 427/126.1; 427/126.2; 427/372.2
[58] Field of Search ............. 427/255.2, 69, 427/255.1, 255, 314, 126.1, 126.2, 248.1, 372.2

[56] References Cited

U.S. PATENT DOCUMENTS

| | | |
|---|---|---|
| 4,812,233 | 3/1989 | Micheli . |
| 4,885,188 | 12/1989 | Hasegawa et al. . |
| 4,981,712 | 1/1991 | Yamamoto et al. . |
| 5,077,092 | 12/1991 | Smith et al. . |
| 5,110,622 | 5/1992 | Hasegawa et al. . |
| 5,185,181 | 2/1993 | Mikami et al. . |
| 5,266,355 | 11/1993 | Wernberg et al. ............... 427/248.1 |
| 5,275,840 | 1/1994 | Mikami et al. . |
| 5,298,295 | 3/1994 | Winter et al. . |
| 5,372,839 | 12/1994 | Mikami et al. . |
| 5,425,966 | 6/1995 | Winter et al. . |

OTHER PUBLICATIONS

Masao Aozasa et al; Jpn. J. Appl. Phys. vol. 29, No. 10, pp. 1997–2002.
Yoshiki Chubachi et al; Jpn. J. Appl. Phys. Part I, vol. 31, No. 1 (1992); pp. 60–66.
Takoa Tohda et al; Jpn. J. Appl. Phys. 30(11A), Nov. 1991, pp. 2786–2790.
R.H. Mauch et al; Journal of Crystal Growth 117 (1992); pp. 964–968.
M. Tammenmaa; Ph.D. Thesis Sponsored by the Academy of Finland; 1989; Abstr. No. N89–28613.

*Primary Examiner*—Roy V. King
*Attorney, Agent, or Firm*—Robert W. Becker & Associates

[57] ABSTRACT

In a method of depositing a metal sulfide film on a substrate a solution containing at least one metal compound precursor comprising at least one thiocarboxylate ligand SECR, wherein E is selected from the group consisting of O and S and wherein R is selected from the group consisting of alkyl, aryl, substituted alkyl, substituted aryl, halogenated alkyl, and halogenated aryl is prepared. The substrate is heated to a reaction temperature. The solution is evaporated to form vapors of the metal compound precursor. The vapors and the substrate heated to the reaction temperature are contacted. The reaction temperature is sufficient to decompose the metal compound precursor to form a metal sulfide film of at least one metal on the substrate.

22 Claims, 25 Drawing Sheets

CHEMICAL VAPOR DEPOSITION OF METAL SULFIDE FILMS FROM METAL THIOCARBOXYLATE COMPLEXES WITH MONODENATE OR MULTIDENTATE LIGANDS

The US Government may have specific rights regarding this invention as provided for in the terms of Contract N00014-91-J1258 awarded by the Office of Naval Research.

FIELD OF THE INVENTION

The present invention is in the field of deposition of metal sulfide films on substrates for application in display technology.

BACKGROUND OF THE INVENTION

Thin film deposition describes a group of techniques for forming a layer of a solid material on a substrate. The layer or film should be homogenous, uniform in thickness, pure and generally crystalline to achieve the most desirable properties. The films deposited for application in display technology are generally required to have all these properties because they are critical to the success of the whole display. Film deposition techniques include vapor phase processes such as physical vapor deposition or chemical vapor deposition, liquid phase processes such as spin-coating or dip coating and solid state deposition process which generally involve sintering a powder at high temperatures. The solid-state route is generally unacceptable for the formation of films to be integrated into electronic devices as a result of the high temperatures required to form the desired properties outlined above.

Metal sulfide thin films, particularly those of the group 2 elements, including CaS, SrS, and BaS, the group 12 elements, including ZnS and CdS, and the group 13 elements, including GaS, $Ga_2S_3$, InS, $In_2S_3$, and combinations thereof, are of interest in applications for display technologies because they can act as host crystalline lattices for rare earth dopants that exhibit luminescent properties. However, the deposition of metal (especially group 2) sulfide films is difficult because suitable volatile sources of these elements are not readily available. Furthermore, it is desirable to use one compound as a source of the group 2, 12, or 13 element and S (often defined as a "single-source precursor" since the metal and sulfur are already present in the desired stoichiometric ratio in a single compound) to aid control over the stoichiometry (M:S ratio) in the final film. At present, no single-source precursors that are volatile are available for the formation of especially group 2 metal sulfide films. It is the consensus of opinion in the field that for commercial exploitation more work is required to develop better preparative methods for the formation of group 2 metal sulfide films. This patent application is concerned with the synthesis and characterization of a general class of single-source precursors of especially group 2, 12, and 13 and other metals and their conversion to metal sulfide films via chemical vapor deposition (CVD).

In the past, usually sputtering and vapor phase routes starting from more than one evaporation source have been used to prepare thin films of optionally doped alkaline earth sulfides. Complex mixtures containing the metal sulfides and the dopant were sputtered in an argon gas stream to form a thin layer (Aozaza et al., Jpn. J.Appl. Phys., Part 1, 1990, 29(10), 1997). Others have reported the formation of SrS films using strontium metal, a dopant and sulfur or $H_2S$ as the sulfur source (Chubachi et al., Jpn. J. Appl. Phys., Part 1, 1992, 31(1), 60; Tohda et al., Jpn. J. Appl. Phys., Part 1, 1991, 30(11A), 2786). Recently, the MOCVD technique has been successfully applied to the deposition of thin layers from precursors such as $Ca(thmd)_2$ and BuSH as the liquid sulfur precursor (Helbing et al., J. Cryst. Growth, 1992, 117, 964). In one case, atomic layer epitaxy (ALE) was used to deposit films using 2,2,6,6-tetramethyl-3,5-heptanedione (tmhd) complexes of alkaline earth metals and $H_2S$ as multiple sources (Tammenmaa, Sci. Tech. Aerosp. Rep., 1989, 27(23), Abstr. No. N89-28613). Major drawbacks of these methods are (1) the lack of accurate stoichiometry in the case of sputtering and CVD (when using multiple sources) and (2) low growth rates when using ALE. Furthermore, gas phase reactions between multiple reagents can lead to powder formation which is extremely detrimental to film growth and properties. These disadvantages should be overcome by using single-source molecular precursors which are sufficiently volatile to grow high quality films.

U.S. Pat. No. 5,425,966 (Winter) refers to a method for depositing a metal chalcogenide (e.g., $TiS_2$) on a substrate by using a single-source precursor resulting from the reaction of a metal halide with an organic chalcogenide (for example, $TiCl_4+Me_2S$).

U.S. Pat. No. 5,298,295 (Winter) discloses a method for depositing a metal chalcogenide (e.g., $TiS_2$) on a substrate by using a single-source precursor resulting from the reaction of a metal halide with an organothiole, for example, $TiCl_4$+t-BuSH. The precursors are slowly sublimated in a vacuum chamber so as to contact a heated substrate.

U.S. Pat. No. 4,981,712 (Yamamoto) relates to MOCVD of a ZnS:Mn film in which a mixed gas containing an organic zinc compound (diethyl or dimethyl zinc), an organic sulfur compound (methyl or ethyl mercaptan), and an organic manganese compound ($Cp_2Mn$) is used.

U.S. Pat. No. 5,185,181 (Mikami) refers to a method for depositing a ZnS:Mn layer by CVD for electroluminescent films. The precursor material is ZnS or zinc and sulfur in combination with a manganese halide. Transport of the material, vaporized at high temperatures of 700°–100° C., into the reaction chamber is effected with a carrier gas $H_2$, HCl. The method provides for coating of a plurality of substrates within the same reaction chamber.

U.S. Pat. No. 5,275,840 (Mikami) describes a method for depositing a ZnS:Mn layer by CVD for electroluminescent films from ZnS and $MnCl_2$. ZnS and $MnCl_2$ are vaporized at high temperatures (700°–1000° C.) and transported via separate inlets to the growth zone, and through a third passage a reducing gas is introduced into the growth zone in order to reduce $MnCl_2$.

U.S. Pat. No. 5,372,839 (Mikami) discloses a method for depositing a ZnS:Mn layer by CVD for electroluminescent films from ZnS and $MnCl_2$. ZnS and $MnCl_2$ are vaporized at high temperatures (800°–1000° C.) and transported by $H_2$ gas or an inert gas onto the substrate.

U.S. Pat. No. 5,077,092 (Smith) relates to a method of depositing a layer of ZnS on a substrate by reacting $H_2S$ with dimethyl zinc wherein the reaction is controlled by the flow rate of dimethyl zinc.

All of these patent documents do not show the use of metal thiocarboxylate compounds for film deposition. None of the patent references shows the use of aerosol-assisted CVD (chemical vapor deposition) for a single-source precursor. A single-source precursor (but not thiocarboxylate) is disclosed in the two Winter patents, but here sublimation in vacuum is used and the sublimated compound is the desired substance to be deposited.

U.S. Pat. No. 4,812,333 discloses the use of organometallic compounds with a M-S bond, for example, thiocarboxylates, to be applied to a substrate and heated for decomposition to a metal sulfide film. The precursor is dissolved in the presence of sulfur in pyridine or $CS_2$. Sulfur is used to increase the solubility. Metals mentioned are Zn, Cd, Cu, Pb.

U.S. Pat. No. 5,110,622 uses organometallic compounds, for example, thiocarboxylates, for spray coating on a substrate and subsequent heating in argon to form a metal sulfide film.

U.S. Pat. No. 4,885,188 uses a solution of organometallic compounds, for example, thiocarboxylates, for spin coating etc. on a substrate and subsequent heating in nitrogen in the presence of $H_2S$ to decompose the precursor and form a metal sulfide film.

These three references disclose the use of thiocarboxylates as a precursor for the formation of metal sulfide films by thermal decomposition. The use of cyclic or acyclic ethers or amines such as crown ethers or like compounds which can act as monodentate or multidentate ligands as a solubility enhancer and in order to increase volatility to make these compounds available for chemical vapor deposition is not disclosed.

It is an object of the present invention to provide a method for the deposition of metal sulfide films by CVD from single-source precursors.

SUMMARY OF THE INVENTION

The method of depositing a metal sulfide film on a substrate according to the present invention is primarily characterized by the steps of:

preparing a solution containing at least one metal compound precursor comprising at least one thiocarboxylate ligand SECR, wherein E is selected from the group consisting of O and S and wherein R is selected from the group consisting of alkyl, aryl, substituted alkyl, substituted aryl, halogenated alkyl, and halogenated aryl;

heating the substrate to a reaction temperature;

evaporating the solution to form vapors of the metal compound precursor; and contacting the vapors and the substrate heated to the reaction temperature, the reaction temperature sufficient to decompose the metal compound precursor to form a metal sulfide film of at least one metal on the substrate.

Preferably, the metal of the metal compound precursor is selected from the group consisting of Ca, Sr, Ba, Zn, Cd, Pb, Ga, In, Sb, and Bi.

Advantageously, the method further comprises the step of producing an aerosol from the solution before the step of vaporizing.

The metal compound precursor may comprise at last one coordinated ligand L selected from the group of monodentate ligands and multidentate ligands.

The metal compound precursor is preferably $M(SECR)_n L_m$.

In another embodiment of the present invention, the method further includes the step of selecting the multidentate ligand from the group consisting of cyclic polyethers, acyclic polyethers, cyclic polyamines, and acyclic polyamines.

The acyclic polyethers may include diglyme, triglyme, tetraglyme, and derivatives of diglyme, triglyme, and tetraglyme.

The polyamines may include ethylene diamine and derivatives thereof and diethylene triamine and derivatives thereof.

The method advantageously further includes the step of selecting the multidentate ligand from the group of crown ethers. The group of crown ethers may include 18-crown-6 ether and derivatives thereof and 15-crown-5 ether and derivatives thereof.

The method may also include the step of selecting the monodentate ligand from the group consisting of an ether and an amine.

In a further embodiment of the present invention, the method may further comprise the step of annealing at a preset annealing temperature the metal sulfide film formed on the substrate.

The step of annealing may include the step of providing an inert atmosphere for the substrate and the metal sulfide film.

Preferably, the preset annealing temperature is selected to be below 700° C. Expediently, the preset annealing temperature is selected to be identical to the reaction temperature.

In yet another embodiment of the present invention, the method further includes the steps of adding to the solution at least one dopant compound comprising a metal dopant selected from the group consisting of Cu, Ag, Au, Eu, Dy, Ho, Er, Tb, Pr, and Ce and selecting a concentration of the metal dopant to be less than 10 weight-% of the metal sulfide film.

Expediently, the reaction temperature is selected to be between 85° C. and 600° C.

The method may also include the step of selecting a preheating temperature for the step of evaporating to be between 70° C. and 250° C.

The solution may contain a first one of the metal compound precursors and a second one of the metal compound precursors to produce a mixed metal sulfide film, wherein the first metal compound precursor contains a different metal than the second metal compound precursor.

The solution contains a third one of the metal compound precursors and the third metal compound precursor contains a different metal than the first and the second metal compound precursors.

The method may further include the steps of adding to the solution of the first and the second metal compound precursors at least one dopant compound comprising a metal dopant selected from the group consisting of Mn, Cu, Ag, Au, Eu, Dy, Ho, Er, Tb, Pr, and Ce and selecting a concentration of the metal dopant to be less than 10 weight-% of the mixed metal sulfide film.

The substrate may be selected from a group consisting of a silicon substrate, a glass substrate, an indium tin oxide substrate, and an aluminum tin oxide substrate.

The metal compound precursor is preferably $(R^1O)_n M(SECR)_m$, wherein $R^1$ is alkyl, aryl, substituted alkyl and substituted aryl.

The present invention provides a method for depositing metal sulfide films and doped metal sulfide films, especially group 2 metal sulfides, MS (M=Ca, Sr, Ba), group 12 metal sulfides, ZnS and CdS, and group 13 metal sulfides, GaS, $Ga_2S_3$, InS, $In_2S_3$, and combinations thereof, e.g., to form $MM'_2S_4$ where M=Ca Sr, Ba, Zn, Cd, and M'=Ga, In, from single-source precursors of the general formula $M(SECR)_n L_m$ or $(R^1O)_n M(SECR)_m$ (where n and m are integers and depend on the valences of the metal, E=O or S, L=monodentate or multidentate ligand such as ethers or amines, in particular 18-crown-6, 15-crown-5, tetraglyme or polyamine, and R=any alkyl, substituted alkyl, aryl, substituted aryl, halogenated alkyl and halogenated aryl) or any other metal compound containing at least one thiocarboxylate substituent (SECR).

It should be noted that the present invention is not limited to the aforementioned metals of groups 2, 12, 13, but is generally is suitable for all metals, in particular also transition elements and lanthanides.

Non-limiting examples for R=alkyl substituents, including substituted and halogenated substituents, are: methyl, ethyl, tert-butyl, neopentyl, $CF_3$. Non-limiting examples for R=aryls are: phenyl, toluyl, xylyl, cyclopentadiene.

The alkyloxides or aryloxides of the $R^1O_nM(SECR)_m$ precursors may include, as non-limiting examples, those with $R^1$=alkyl substituents, including substituted and halogenated substituents, such as i-propyl, tert-butyl, and neopentyl. Non-limiting examples for $R^1$=aryls are: phenyl, toluyl, xylyl, cyclopentadiene.

The alkyloxide or aryloxide substituents enhance the solubility and volatility of the metal thiocarboxylate precursors. Likewise, the monodentate or multidentate ligands, L, render the title compounds more volatile than the same compounds in the absence of L. As a result, these precursor compounds are suitable for the deposition of metal sulfide films by low temperature CVD. The metal sulfide films formed are stoichiometric and pure as a result of the elimination of the organic ligands, for example, according to the proposed reaction $M(SECR)_n.L \rightarrow MS+n/2 (RCE)_2S+L$ (depending on the valences of the metal, metal sulfides of other stoichiometry such as $M_2S_3$ will be formed). This invention shows how these compounds, especially where M=Ca, Sr, Ba, Zn, Cd, Ga, and In, E=O, and R=methyl (i.e., thioacetate MeCOS, abbreviated in the following as SAc), can be used to deposit crystalline metal sulfide films on any suitable substrate by low temperature CVD.

BRIEF DESCRIPTION OF THE DRAWINGS

The object and advantages of the present invention will appear more clearly from the following specification in conjunction with the accompanying Tables 1–4 and drawings, in which.

DESCRIPTION OF PREFERRED EMBODIMENTS

Figure 1:
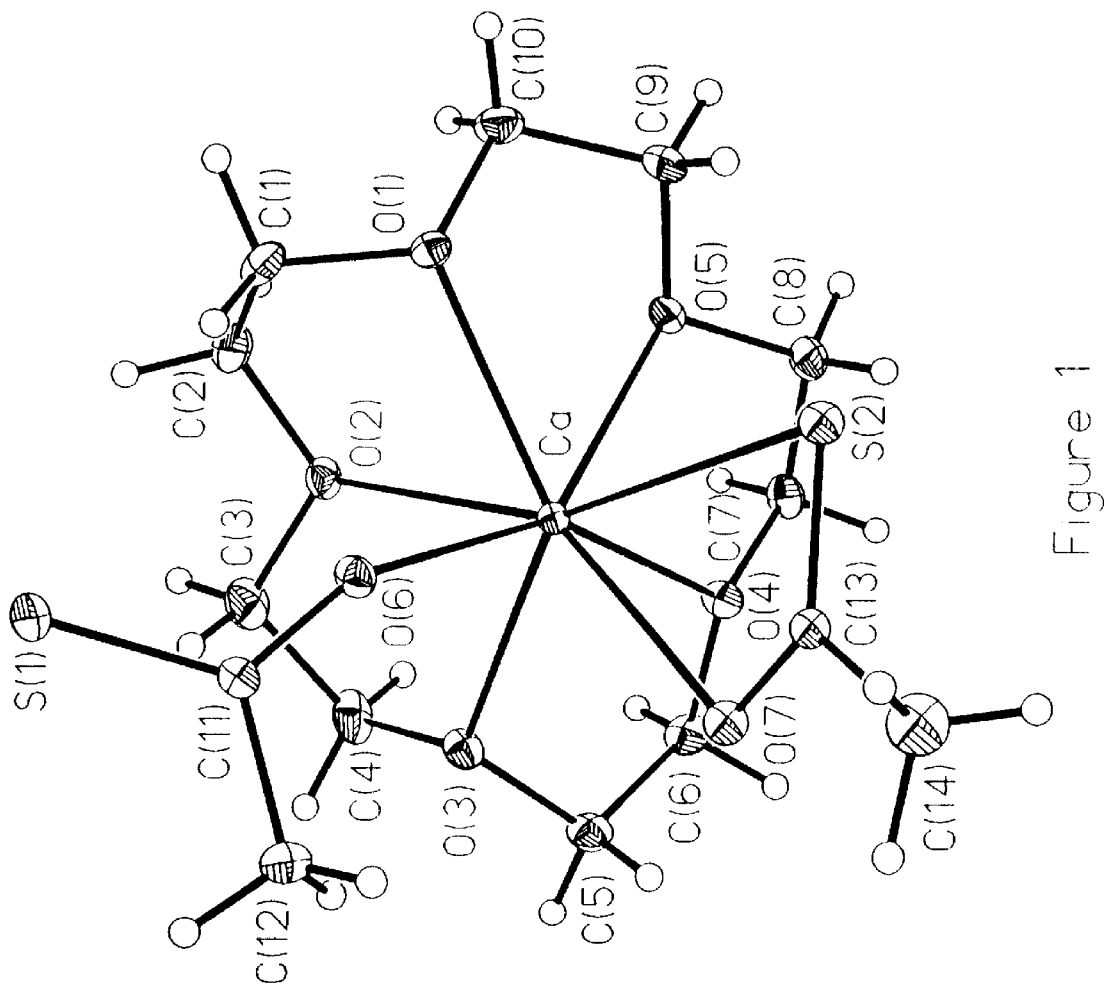
FIG. 1 shows the crystal structure of $Ca(SAc)_2.15$-crown-5 in the solid state.
Figure 2:
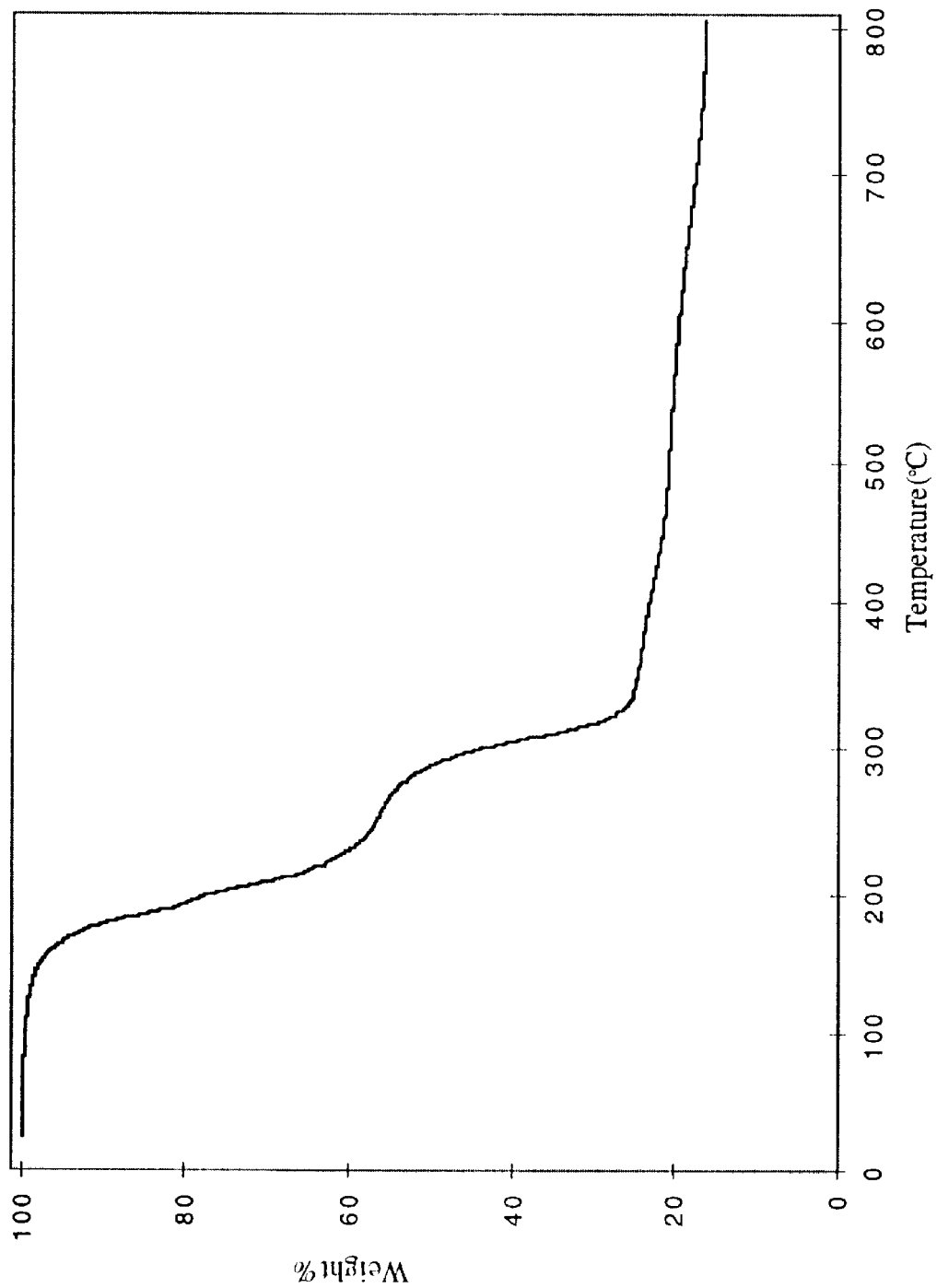
FIG. 2 shows a TGA of $Ca(SAc)_2.15$-crown-5 in $N_2$ atmosphere.
Figure 3:
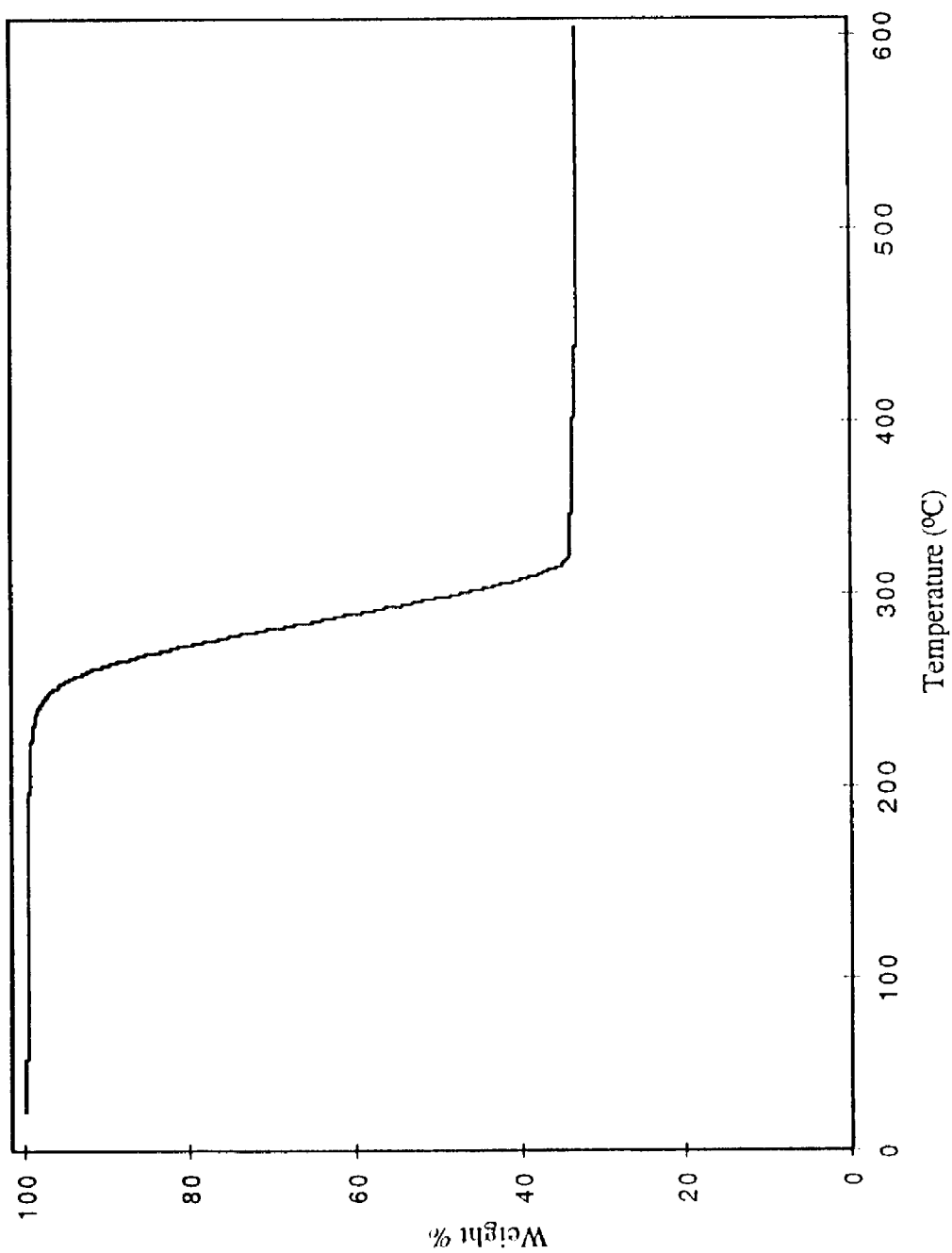
FIG. 3 shows a TGA of $Ba(SAc)_2.18$-crown-6 in $N_2$ atmosphere.

The present invention will now be described in detail with the aid of several specific embodiments utilizing the FIGS. 1–25 and the Tables 1–4.

The invention describes the synthesis and characterization of a number of metal thioacetate compounds and their use in the formation of various metal sulfide films. First the synthesis and characterization of the compounds is described followed by the formation of metal sulfide films.

Synthesis of Group 2 Metal Compounds $M(SAc)_2.L$ with Crown Ether Ligands (L=15-crown-5, 18-crown-6, 12 crown-4) (M =Ba, Ca, Sr)

Method 1) The reactions were carried out under nitrogen using Schienk technique. To a 100 ml flask were added 7 mmol of $MH_2$, 7 mmol of L (L=15-crown-5, 18-crown-6), 1.0 ml of HSAc (14 mmol) and 40 ml of dry THF. The solutions were stirred at room temperature (RT) for 12 hrs, followed by removal of the solvent under reduced pressure to leave a white solid. The crude products were recrystallized by slow addition of ether to an ethanol solution. $Sr(SAc)_2.15$-crown-5 was obtained in 45% yield. Similar yields were obtained for the other compounds.

Method 2) The reactions were carried out under air. To a 100 ml beaker were added 7 mmol of $MCO_3$, 7 mmol of L (L =15- crown-5, 18-crown-6, 12-crown-4), 1.0 ml of HSAc (14 mmol) and 30 ml of distilled water. The clear solutions were stirred at RT to evaporate the water. The crude products were recrystallized by slow addition of ether to an ethanol solution. The crystals were kept under nitrogen atmosphere. The yields obtained were similar to method 1.

Characterization data of the prepared compounds are represented in Tables 1–3, wherein $L^1$=15-crown-5; $L^2$=18-crown-6; and $L^3$=12-crown-4.

TABLE 1

NMR Data

| | $^1$H NMR/ppm (methanol-$d_4$) | | $^{13}$C NMR/ppm (methanol-$d_4$) | | |
|---|---|---|---|---|---|
| | CH$_3$ | L | CH$_3$ | L | SC(O) |
| Ca(SAc)$_2$.L$^1$ | 2.41 | 3.78 | 38.4 | 70.1 | 222.2 |
| Ca(SAc)$_2$.L$^3$ | 2.41 | 3.77 | 38.8 | 69.2 | 222.5 |
| Sr(SAc)$_2$.L$^1$ | 2.40 | 3.83 | 38.5 | 69.7 | 221.4 |
| Ba(SAc)$_2$.L$^2$ | 2.39 | 3.78 | 38.8 | 71.3 | 222.0 |

TABLE 2

Elemental Analysis Data

| | % C | | % H | |
|---|---|---|---|---|
| | found | calc. | found | calc. |
| Ca(SAc)$_2$.L$^1$ | 40.84 | 40.96 | 6.52 | 6.38 |
| Ca(SAc)$_2$.L$^3$ | 36.91 | 39.33 | 5.80 | 6.05 |
| Sr(SAc)$_2$.L$^1$ | 36.51 | 36.60 | 5.90 | 5.67 |
| Ba(SAc)$_2$.L$^2$ | 34.32 | 34.83 | 5.67 | 5.88 |

TABLE 3

IR Data for (C═O)/cm$^{-1}$

| | |
|---|---|
| Ca(SAc)$_2$.L$^1$ | 1542, 1516, 1637 |
| Ca(SAc)$_2$.L$^3$ | 1534, 1499 |
| Sr(SAc)$_2$.L$^1$ | 1549, 1527 |
| Ba(SAc)$_2$.L$^2$ | 1533 |

Determination of Molecular Structure of the Crown Ether Adducts

In order to determine the coordination of the thioacetate groups and the degree of oligomerization in the solid state, Ca(SAc)$_2$.15-crown-5 was structurally characterized in the solid state by single crystal X-ray diffraction analysis. The X-ray diffraction analysis showed that in the solid state Ca(SAc)$_2$.15-crown-5 is monomeric (see FIG. 1). The calcium atom is eight-coordinate by binding to all oxygen atoms of the 15-crown-5 ring, the oxygen and sulfur of one chelated thioacetate and the oxygen of the other thioacetate ligand. The sulfur atom of the second thioacetate ligand dangles. It is not coordinated with the calcium atom and there is no evidence for intermolecular interaction to adjacent molecules. These data clearly demonstrate that this species is monomeric and likely to be soluble in organic solvents and suitable for chemical vapor deposition, in particular aerosol-assisted CVD.

Thermal Decomposition Studies (TGA) of M(SAc)$_2$.L with M =Ca, Sr, Ba; L=15-crown-5, 18-crown-6, 12-crown-4

In general, thermal decomposition (thermogravimetric analysis=TGA) of M(SAc)$_2$.L with M=Ca, Sr, Ba and L=15-crown-5, 18-crown-6, and 12-crown-4 in air resulted in the loss of the polyether ligand and formation of the mixtures of the corresponding oxides, carbonates and sulfates. However, crystalline SrS was obtained in air at 600° C. Thermal decomposition in nitrogen resulted in the loss of the polyether ligand and formation of the corresponding crystalline metal sulfide at 300° C. The metal sulfide was easily oxidized to the metal sulfate at high temperatures even by small amounts of air, for example, in the case of BaS.

For Ca(SAc)$_2$. 15-crown-5 in nitrogen a two-step process (see FIG. 2) was observed. The respective weight losses can be attributed to the loss of 15-crown-5 and thioacetate anhydride Ac$_2$S.

For the Ba and Sr compounds (see FIG. 3) a one step process was observed. The total mass loss corresponds to the loss of polyether and Ac$_2$S. Metal sulfide was formed only in nitrogen at 600° C.

Figure 4:
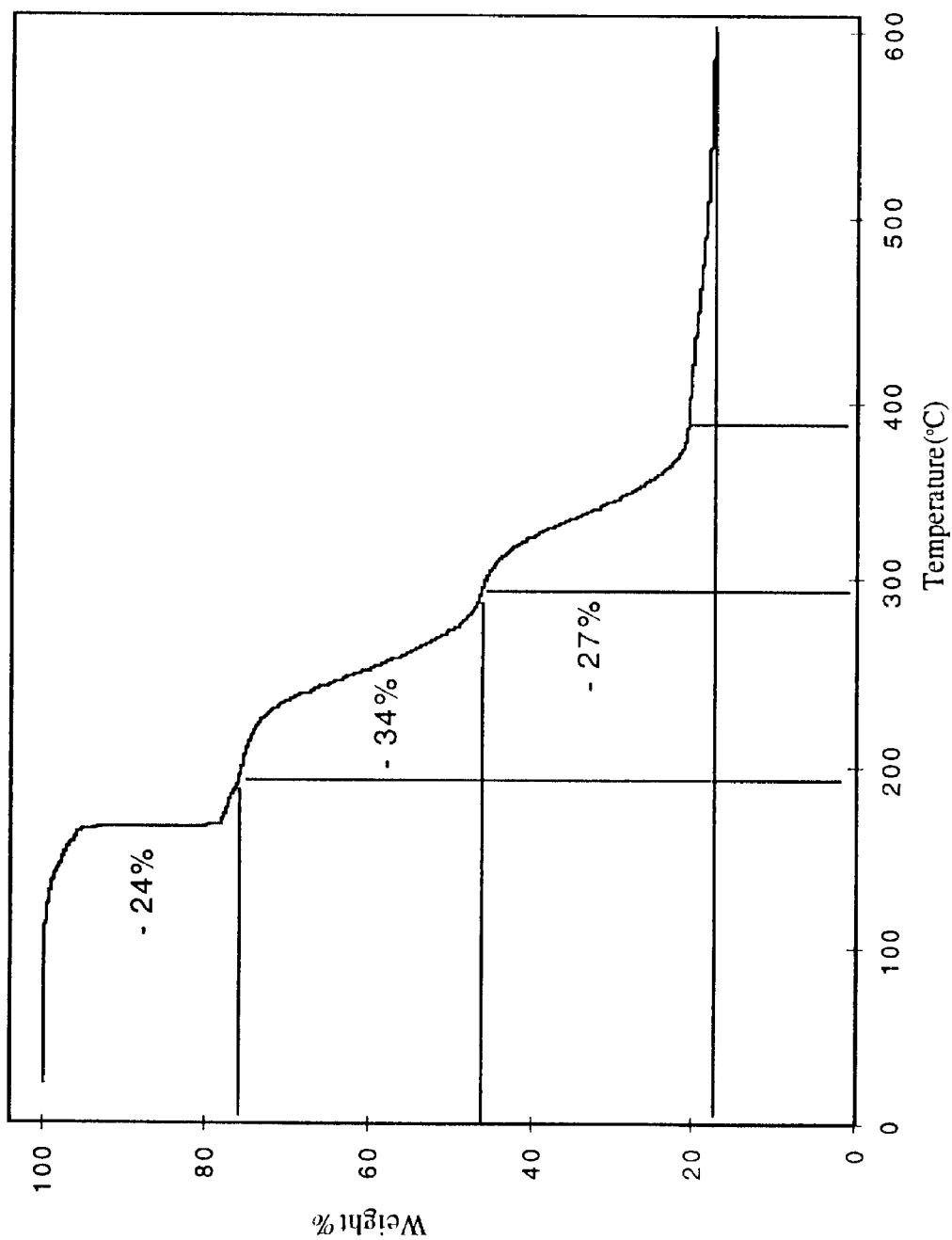
FIG. 4 shows a TGA of $Ca(SAc)_2.12$-crown-4 in $N_2$ atmosphere.
Figure 5:
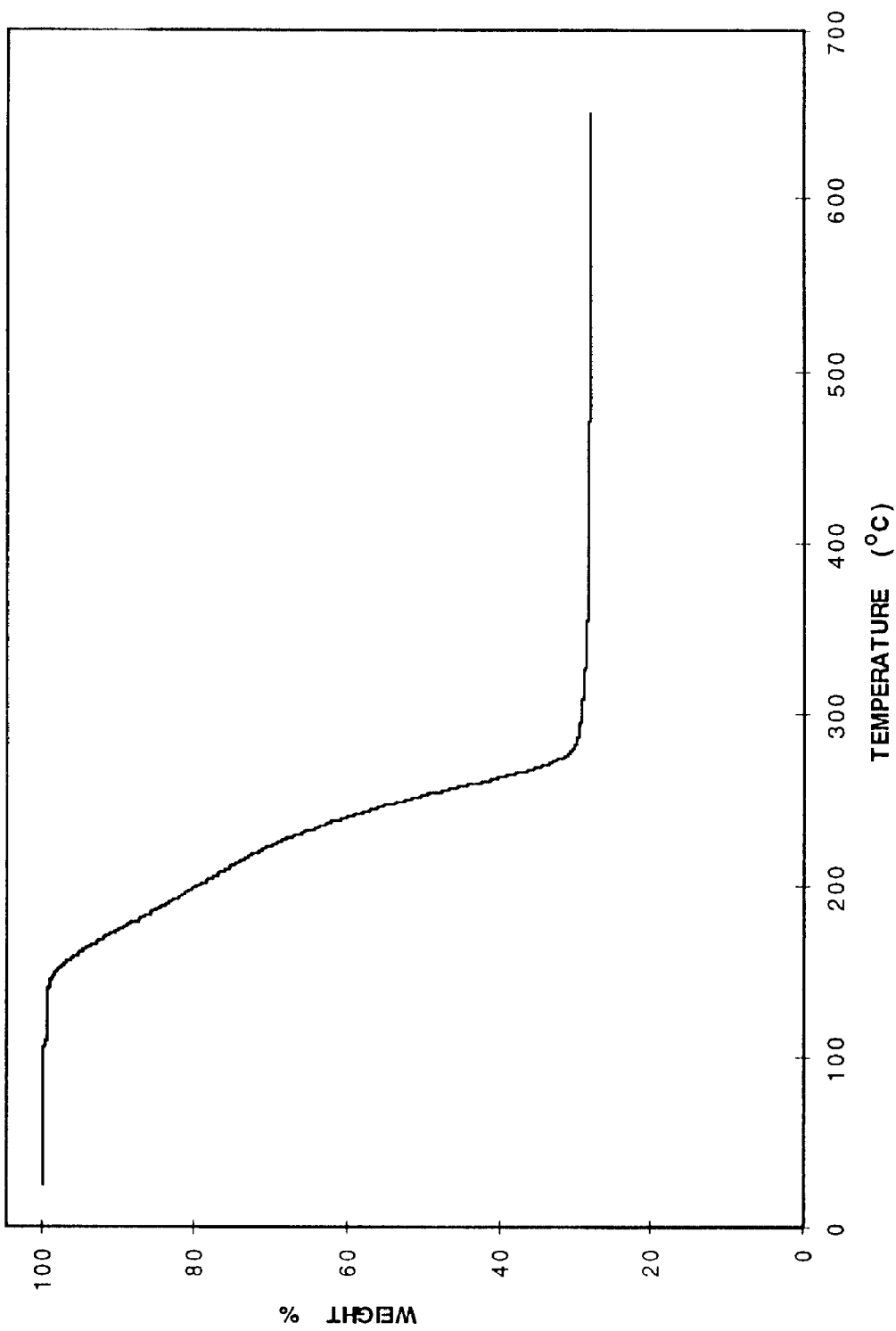
FIG. 5 shows a TGA of $Cd(SAc)_2.18$-crown-6 in $N_2$ atmosphere.

The thermal composition of Ca(SAc)$_2$.12-crown-4 in nitrogen differed from the decomposition process of Ca(SAc)$_2$.15-crown-5 in nitrogen (see FIG. 4). A three-step process was observed for Ca(SAc)$_2$. 15-crown-5 and the final crystalline product was only CaS.

The results of the TGA experiments are compiled in Table 4.

TABLE 4

TGA Data

| | air | | nitrogen | |
|---|---|---|---|---|
| | T/°C. | Cryst. Prod. | T/°C. | Cryst. Prod. |
| Ca(SAc)$_2$.L$^1$ | 900 | CaSO$_4$/CaO | 800 | CaS/CaO/Ca |
| Ca(SAc)$_2$.L$^3$ | | | 600 | CaS |
| Sr(SAc)$_2$.L$^1$ | 800 | SrS/SrSO$_4$ | 600 | SrS |
| | 600 | SrS | | |
| Ba(SAc)$_2$.L$^2$ | 600 | BaSO$_4$/BaCO$_3$ | 900 | BaSO$_4$ |
| | | | 600 | BaS |

Ca(SOCMe)$_2$.THF

Ca(SOCMe)$_2$.THF 0.295 g (7 mmol) CaH$_2$ was stirred in 40 ml of THF at 0° C. and 1 ml (14 mmol) thioacetic acid was added. The solution was stirred for 12 hrs at RT. After filtration the resulting clear yellow solution was reduced in volume by evaporating the solvent in vacuum. A yellow crystalline powder was isolated. The final yield was 5.20 g (70.7%).

Elemental Analysis: Calc. for C$_8$H$_{14}$O$_3$S$_2$Ca (MW 262.40): C: 36.62, H: 5.38; found: C: 35.97, H: 5.62.

$^1$H NMR (δ in ppm; CDCl$_3$): 1.84 (4H, t); 2.49 (6H, s); 3.82 (4H, t); (δ in ppm; C$_6$D$_6$): 1.34 (4H, t); 2.77 (6H, s); 3.69 (4H, t).

$^{13}$C{$^1$H}-NMR (δ in ppm; CDCl$_3$): 25.4 (THF, s); 37.9 (H$_3$C—C(O)S, s); 68.9 (THF, s); 230.1 (H$_3$C—C(O)S, s).

$^{13}$C CP-MAS-NMR (δ in ppm): 25.78 (THF, s); 38.08 (H$_3$C—C(O)S, s); 69.71 (THF, s); 230.80 (H$_3$C—C(O)S, s).

Ca(SOCMe)$_2$.2 Py 0.295 g (7 mmol) CaH$_2$ was stirred in 40 ml of Pyridine at 0° C. as 1 ml (14 mmol) thioacetic acid was added. The solution was stirred for 12 hrs at RT. After filtration the resulting clear yellow solution was reduced in volume by evaporating the solvent in vacuum. A colorless powder was isolated. The final yield was 48%.

Elemental Analysis: Calc. for C$_{14}$H$_{16}$O$_2$N$_2$S$_2$Ca (MW 348.49): C: 36.62; H: 5.38; found: C: 35.97; H: 5.62.

$^1$H NMR (δ in ppm; CD$_3$OD): 2.41 (6H, s); 7.43 (Py, m); 7.84 (Py, m); 8.53 (Py, m).

$^{13}$C{$^1$H}-NMR (δ in ppm; CD$_3$OD): 38.2 (H$_3$C—C(O)S, s); 125.6 (Py, s); 138.4 (Py, s); 150.0 (Py, s); 222.7 (H$_3$C—C(O)S, s).

Sr(SOCMe)$_2$. 18-crown-6

To 1.033 g (7 mmol) SrCO$_3$ and 1.85 g (7 mmol) 18-crown-6, suspended in 30 ml distilled water, was added under stirring 1 ml (14 mmol) of thioacetic acid. The reaction was complete after $CO_2$ evolution had ceased (ca. 15 min). The slurry was stirred for 24 hrs to an almost colorless paste. The product was extracted with 30 ml ethanol and filtered. Colorless to pale yellow crystals were isolated by slow condensing of ether in a concentrated ethanol solution. The yield was 1.66 g (47%) and could be increased by collecting the second crystalline fraction from the supernatant.

Elemental Analysis: Calc. for $C_{16}H_{30}O_8S_2Sr$ (MW 502.15): C: 38.27, H: 6.02; found: C: 37.86, H: 6.55.

$^1$H NMR ($\delta$ in ppm; $CD_3OD$): 2.40 (6H, s); 3.82 (24H, s).

$^{13}C\{^1H\}$-NMR ($\delta$ in ppm: $CD_3OD$): 38.5 ($H_3C$—C(O)S, s); 71.2 (O—$CH_2$—$CH_2$—O, s); 221.6 ($H_3C$—C(O)S, s).

Sr(SOCMe)$_2$. 15-crown-5

Synthesis and workup similar to Sr(SOCMe)$_2$.18-crown-6 has been employed. Colorless to pale yellow crystals were isolated. The final yield was 56%.

Elemental Analysis: Calc. for $C_{14}H_{26}O_7S_2Sr$ (MW 458.10): C: 36.71, H: 5.72; found: C: 36.51, H: 5.90.

$^1$H NMR ($\delta$ in ppm; $CD_3OD$): 2.40 (6H, s); 3.83 (20H, s).

$^{13}C\{^1H\}$-NMR ($\delta$ in ppm; $CD_3OD$): 38.5 ($H_3C$—C(O)S, s); 69.7 (O—$CH_2$—$CH_2$—O, s); 221.4 ($H_3C$—C(O)S, s).

IR: n(C=O) 1527, 1549 cm$^{-1}$.

Ba(SOCMe)$_2$. 15-crown-5

To 1.38 g (7 mmol) $BaCO_3$ and 1.39 ml (7 mmol) 15-crown-5, suspended in 40 ml distilled water, was added under stirring 1 ml (14 mmol) of thioacetic acid. The reaction was complete after $CO_2$ evolution had ceased (ca. 15 min). The slurry was stirred for 24 hrs to an almost colorless paste. The product was extracted with 40 ml ethanol and filtered. Colorless crystals were isolated by slow condensing of ether in a concentrated ethanol solution. The final yield was 2.54 g (71.5%).

Elemental Analysis: Calc. for $C_{14}H_{26}O_7S_2Ba$ (MW 507.81): C: 33.11, H: 5.16; found: C: 33.01, H: 5.13.

$^1$H NMR ($\delta$ in ppm; $CD_3OD$): 2.40 (6H, s); 3.86 (20H, s).

$^{13}C\{^1H\}$-NMR ($\delta$ in ppm; $CD_3OD$): 38.8 ($H_3C$—C(O)S, s); 69.9 (O—$CH_2$—$CH_2$—O, s); 221.1 ($H_3C$—C(O)S, s).

Ba(SOCMe)$_2$. 18-crown-6.½$H_2O$

Synthesis and workup similar to Ba(SOCMe)$_2$.15-crown-5 was employed. Colorless crystals were isolated. The final yield was 76%.

Elemental Analysis: Calc. for $C_{16}H_{31}O_{8.5}S_2Ba$ (MW 560.87): C: 34.26, H: 5.57; found: C: 34.32, H: 5.67.

$^1$H NMR ($\delta$ in ppm; $CD_3OD$): 2.39 (6H, s); 3.78 (24H, s).

$^{13}C\{^1H\}$-NMR ($\delta$ in ppm: $CD_3OD$): 38.8 ($H_3C$—C(O)S, s); 71.3 (O—$CH_2$—$CH_2$—O, s); 221.0 ($H_3C$—C(O)S, s).

IR: n(C=O) 1533 cm$^{-1}$.

Preparation of Group 12 Metal compounds

Cd(SAc)$_2$.18-crown-6

The reaction was carried out under air. To a 100 ml beaker were added 7 mmol of $CdCO_3$, 7 mmol of 18-crown-6, 1.0 ml of HSAc (14 mmol) and 30 ml of distilled water. The clear solution was stirred at RT to evaporate the water. A pale yellow powder was obtained.

$^1$H NMR(methanol-d$_4$): 2.59 (s, 6H), 3.4 (s, 24H), 3.51 (s 8H).

$^{13}$C NMR (methanol-d$_4$): 35.8 (s), 69.7 (s), 71.1 (s).

Figure 6:
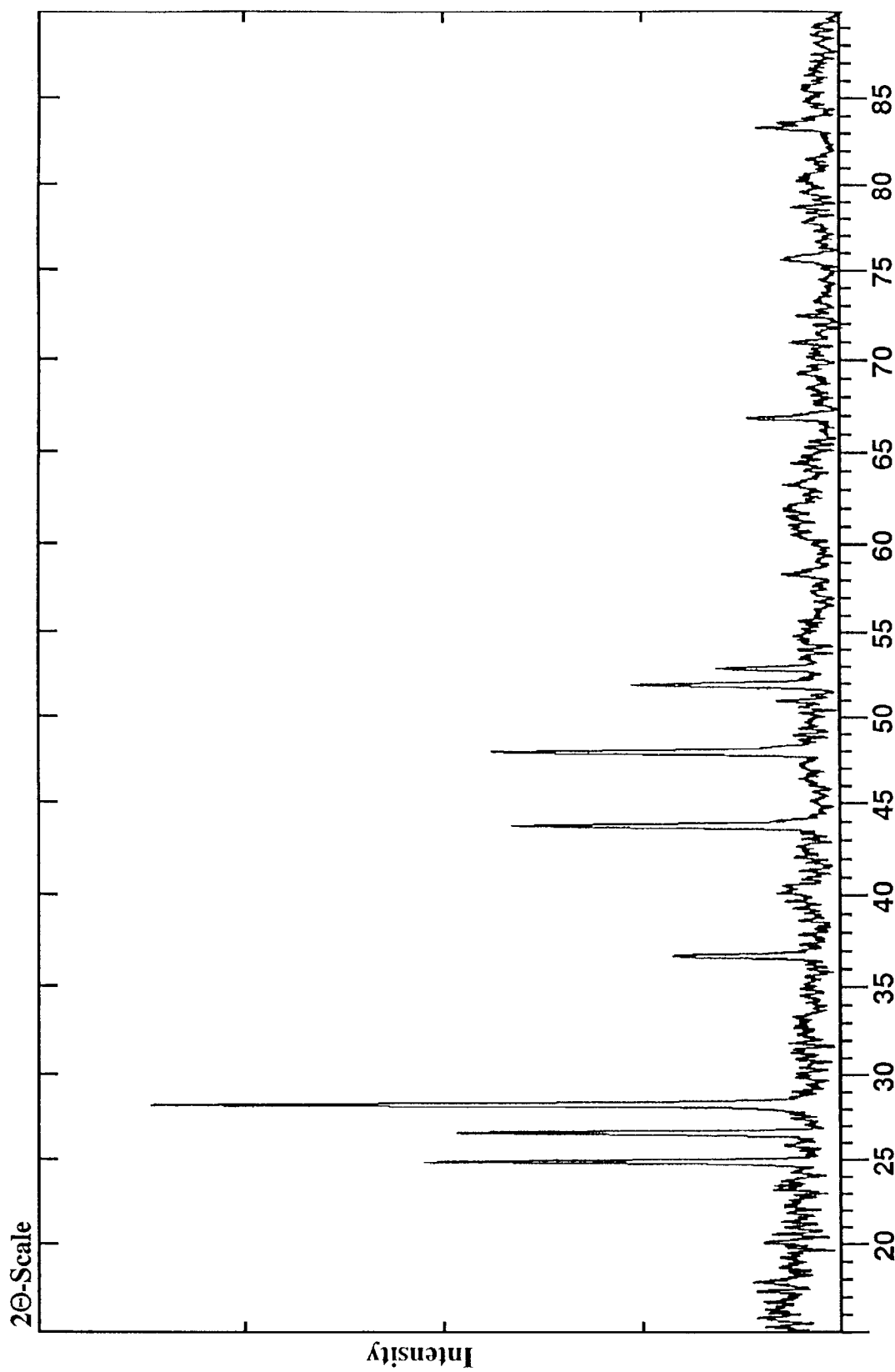
FIG. 6 shows powder X-ray diffraction data of CdS as formed by thermal decomposition of $Cd(SAc)_2.18$-crown-6.

The thermal decomposition of Cd(SAc)$_2$.18-crown-6 (see FIG. 5) in nitrogen produced crystalline CdS (see FIG. 6). The total mass loss was 72% corresponding to the loss of 18-crown-6 and the loss of thioacetate anhydride Ac$_2$S. The mass loss above 800° C. is due to the sublimation of CdS.

[($^t$BuO)Cd(SOCMe)]$_4$

Method A): 1.79 g (3.4 mmol) Cd(SOCMe)$_2$.18-crown-6 and 0.88 g (3.4 mmol) Cd(O$^t$Bu)$_2$ were dissolved in 100 ml ether at RT. After 8 hrs the white slurry obtained was filtered and all volatiles removed under reduced pressure. The resulting white powder was recrystallized from toluene/hexane (1:4).

Method B): 1.32 g (5.1 mmol) Cd(O$^t$BU)$_2$ were suspended in 130 ml ether. 0.39 g (5.1 mmol) thioacetic acid was added at RT and the reaction solution stirred for 2 hrs. Workup as described under method 1.

$^1$H NMR ($\delta$ in ppm; $C_6D_6$): 1.64 (9H, s); 2.23 (3H, s, $J^{1H-113/111Cd}$=6.3 Hz, 33% of the main signal).

$^{13}C\{^1H\}$-NMR ($\delta$ in ppm; $C_6D_6$): 32.68 ($H_3C$—C(O)S, s, $J^{13C-113/111Cd}$=51 Hz); 34.03 (($CH_3$)$_3$—CO, s); 75.31 (($CH_3$)$_3$—CO, s); 207.98 ($H_3C$—C(O)S, s, $J^{13C-113/111Cd}$= 34 Hz).

$^{113}Cd\{^1H\}$-NMR ($\delta$ in ppm; $C_6D_6$): 202.76, s, $J^{113Cd-111CD}$=34 Hz, 45% of the main signal.

Cd(SOCCH$_3$($_2$TMEDA

Cadmium carbonate (1.00 g, 5.8 mmol) was placed in round-bottom flask with 25 mL toluene and 0.68 g (5.8 mmol) N, N, N, N-tetramethyl ethylenediamine. While stirring, 0.83 mL thioacetic acid was added (0.88 g, 11.6 mmol). An exothermic reaction took place immediately, as observed by $CO_2$ evolution. The mixture was stirred for 1 hour to obtain a toluene solution of Cd(SOCCH$_3$)$_2$TMEDA, and a yellowish precipitate containing a mixture of Cd(SOCCH$_3$)$_2$TMEDA, CdS, and other unidentified byproducts (decomposition of Cd(SOCCH$_3$)$_2$TMEDA to form CdS likely occurs by reaction with water produced in the reaction). The toluene solution was placed in the freezer and the product Cd(SOCCH$_3$)$_2$TMEDA crystallized out overnight as colorless blades. Yield: 1.00 g (45% based on Cd).

Elemental analysis: Calculated 31.7% C, 5.8% H, 7.4% N; Found: 31.7% C, 5.4% H, 7.1% N.

TGA: The sample of Cd(SOCCH$_3$)$_2$TMEDA decomposed in one step around 200° C. with 38% wt. remaining (MW (CdS)/MW (Cd(SOCCH$_3$)$_2$TMEDA)×100=38%. The inorganic residue in the TGA pan was identified as hexagonal CdS by powder X-ray diffraction.

$^1$H NMR data ($C_6D_6$): $\delta$=1.79 (s, $N_2(CH_3)_4C_2\underline{H}_4$, $^3J^{111,113}Cd$-$^1H$=4.75 Hz) total integrated area of satellites with respect to main peak =25%, $\delta$=2.03 (s, $N_2(C\underline{H}_3)_4C_2H_4$, $^3J^{111,113}Cd$-$^1H$=4.75 Hz) total integrated area of satellites with respect to main peak =25%, $\delta$=2.45 (s, $C\underline{H}_3CSO$).

$^{13}C$ NMR data ($C_6D_6$): $\delta$=34.54 (s, $N_2(CH_3)_4\underline{C}_2H_4$), $\delta$=46.26 (s, $N_2(\underline{C}H_3)_4C_2H_4$), $\delta$=56.61 (s, $\underline{C}H_3CSO$), $\delta$=250 (s, $CH_3\underline{C}SO$).

$^{113}Cd$ NMR data ($C_6D_6$): $\delta$=346.4.

Figure 7:
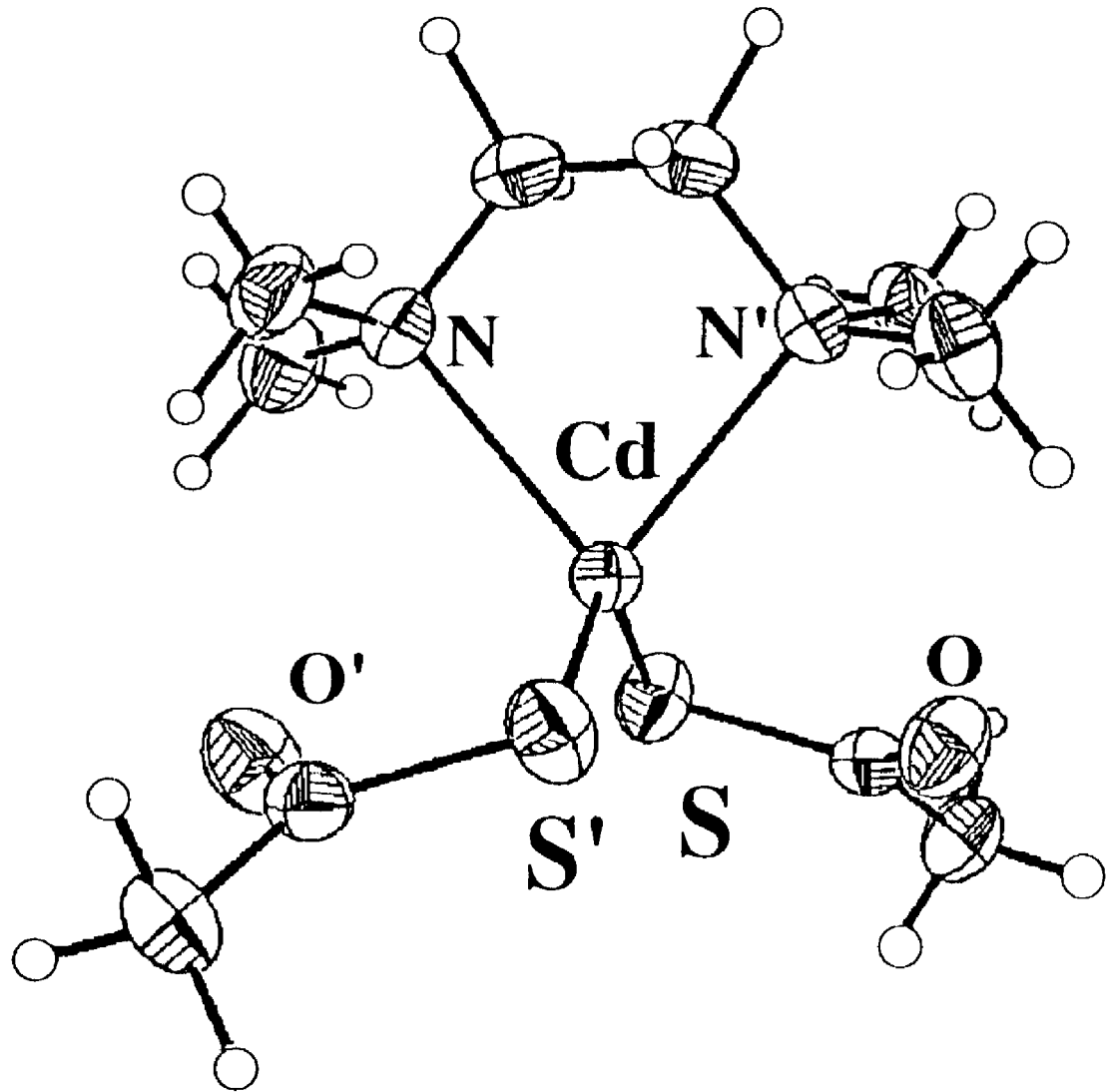
FIG. 7 shows the crystal structure of $Cd(SAc)_2.TMEDA$ in the solid state.

The structure was determined by single crystal X-ray diffraction (see FIG. 7).

Zn(SOCCH$_3$)$_2$.TMEDA

Diethyl zinc (1 g, 8.1 mmol), 25 mL dry toluene and 0.94 g (8.1 mmol) N, N, N, N-tetramethyl ethylenediamine were combined in a round-bottom flask in an inert atmosphere box. The flask was removed from the box and placed in a dry ice-acetone bath. Thioacetic acid (1.16 mL, 16.2 mmol) was syringed into the flask while stirring. A white precipitate was formed immediately. The mixture was allowed to warm to RT and stirred for several hours. The mixture was then heated to 70° C. to allow most of the precipitate to dissolve, and the hot solution was immediately filtered. The product crystallized out of the solution as long colorless blades while standing at RT overnight. Yield: 2.5 g (93% based on Zn).

Elemental analysis: Calc: 36.2% C, 6.6% H, 8.4% N; Found: 36.12% C, 6.79% H, 8.34% N.

TGA: The sample of Zn(SOCCH$_3$)$_2$TMEDA decomposed in one step around 200° C. with 30% wt. remaining (MW (ZnS)/MW (Zn(SOCCH$_3$)$_2$TMEDA)×100=29%. The inorganic residue in the TGA pan was identified as poorly crystalline hexagonal or cubic ZnS by powder X-ray diffraction.

$^1$H NMR (C$_6$D$_6$): δ=1.87 (s, N$_2$(CH$_3$)$_4$C$_2$H$_4$), δ=2.12 (s, N$_2$(CH$_3$)$_4$C$_2$H$_4$), δ=2.45 (s, CHSO).

$^{13}$C NMR: (C$_6$D$_6$): δ=35.66 (s, N$_2$(CH$_3$)$_4$C$_2$H$_4$) δ=46.60 (s, N$_2$(CH$_3$)$_4$C$_2$H$_4$), δ=56.61 (s, CH$_3$CSO), δ=250 (s, CH$_3$CSO).

Cd(SOCCH$_3$)$_2$Lu$_2$ (Lu=3,5-lutidine)

Cadmium carbonate (1 g, 5.80 mmol) and 3,5-lutidine (1.24 g, 11.60 mmol) and 20 mL toluene were combined in a round-bottom flask. Thioacetic acid (0.88 g, 11.60 mmol) was dropped into the mixture while stirring rapidly, and stirring was continued for 1 hour at RT. As the reaction proceeded, the solid cadmium carbonate disappeared, CO$_2$ bubble formation was observed and the resulting clear solution took on a yellow color. The toluene and volatile byproducts of the reaction (water) were removed under reduced pressure, and a white crystalline solid and a small amount of yellow cadmium sulfide remained. The solid was redissolved in toluene and filtered to remove the cadmium sulfide. The solution was placed in the freezer to yield colorless, blocky crystals. Yields ranged from 2.0 g–2.5 g (59%–74% based on Cd).

Elemental analysis: Calculated; 45.34% C, 5.04% H and 5.88% N; found; 45.30% C, 5.14%H and 5.68% N.

TGA: The sample of Cd(SOCCH$_3$)$_2$Lu$_2$ decomposed in one step around 150° C. with 32% wt. remaining (MW (CdS)/MW (Cd(SOCCH$_3$)$_2$Lu$_2$)×100 =30%. The inorganic residue in the TGA pan was identified as hexagonal CdS by powder X-ray diffraction.

$^1$H NMR data (C$_6$D$_6$): 1.69 ppm [12H, CH$_3$-lutidine], 2.58 ppm [6H, SOCCH$_3$], 6.55 ppm [1H, lutidine para-CH], 8.50 ppm [2H, lutidine ortho-CH].

$^{13}$C NMR data: 17.8 ppm [CH$_3$-lutidine], 35.1 ppm [SOCCH$_3$], 133.7 ppm [C—CH$_3$-lutidine], 138.8 ppm [para-CH-lutidine], 147.7 ppm [ortho CH-lutidine].

$^{113}$Cd NMR data: 353.5 ppm.

Figure 8:
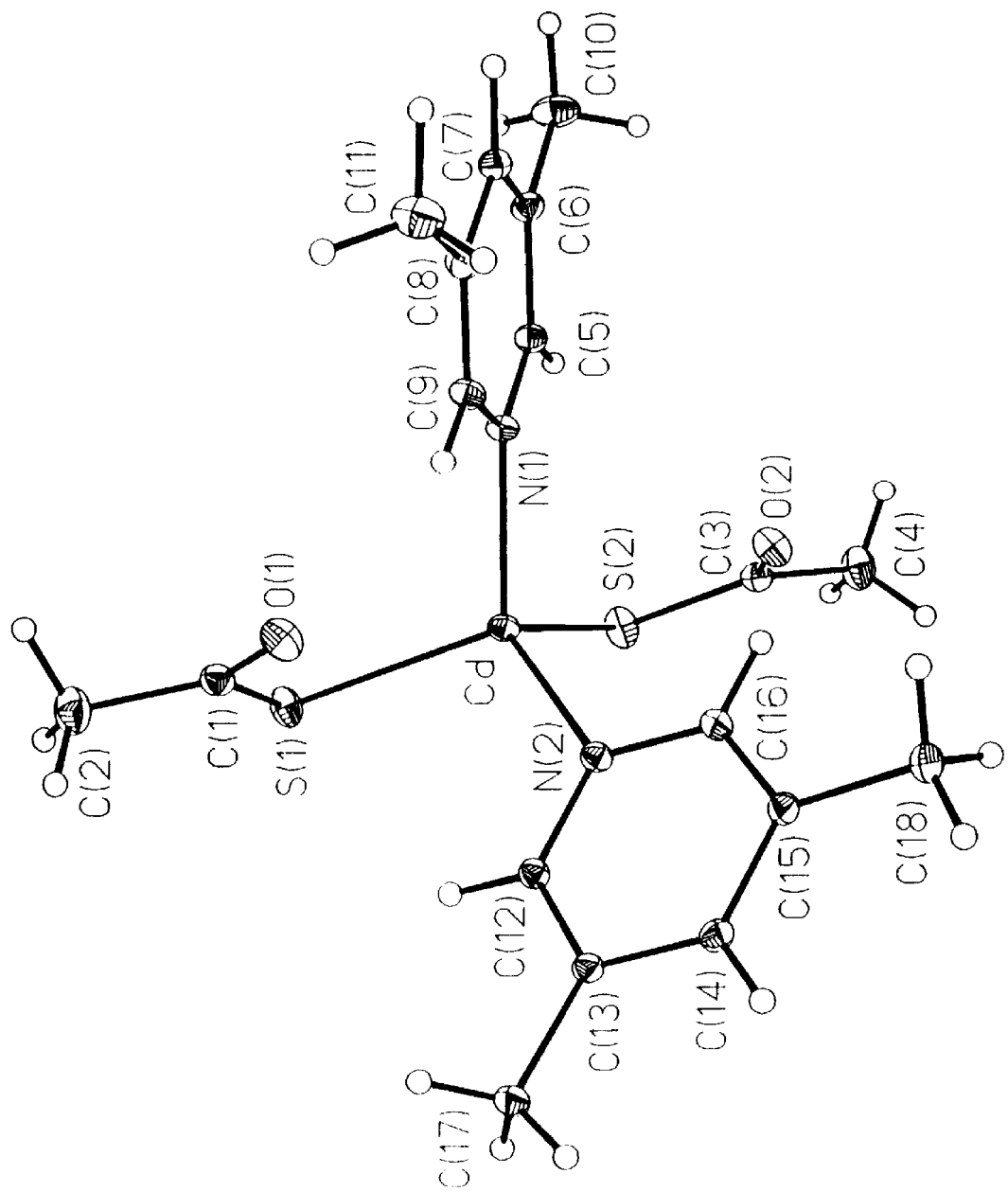
FIG. 8 shows the crystal structure of $3,5-Lu_2.Cd(SAc)_2$ in the solid state.

Single crystal X-ray diffraction was used to determine the structure of the compound (see FIG. 8).

Zn(SOCCH$_3$)$_2$Lu$_2$ (Lu=3,5-lutidine)

Diethyl zinc (1 g, 8.1 mmol), lutidine (1.73 g, 16.2 mmol) and 20 mL toluene were combined in a round-bottom flask in an inert atmosphere box. The flask was removed from the inert atmosphere box and placed in a dry ice-acetone bath. Thioacetic acid (1.16 mL, 16.2 mmol) was added to the solution via a pipette while stirring, and a white precipitation formed immediately. The solution was warmed to RT while stirring. After several hours, the solution was heated to 60° C. to dissolve most of the reaction product, and the hot solution was filtered immediately. The product crystallized at RT overnight as small colorless blocks. Yield: 2.7 grams (78% based on Zn).

Elemental analysis: Calculated: 50.3% C, 5.59% H and 6.52% N; found: 50.4% C, 5.70% H and 6.37% N.

TGA: The sample of Zn(SOCCH$_3$)$_2$Lu$_2$ decomposed in one step around 175° C. with 25% wt. remaining (MW (ZnS)/MW (Zn(SOCCH$_3$)$_2$Lu$_2$)×100=23%. The inorganic residue in the TGA pan was identified as poorly crystalline hexagonal or cubic ZnS by powder X-ray diffraction.

$^1$H NMR data (C$_6$D$_6$): 1.63 ppm [12H, CH$_3$-lutidine], 2.55 ppm [6H, SOCCH$_3$], 6.47 ppm [2H, lutidine para-CH], 8.78 ppm [4H, lutidine ortho-CH].

$^{13}$C NMR data: 17.8 ppm [CH$_3$-lutidine], 36.1 ppm [SOCCH$_3$], 134.3 ppm [C—CH$_3$-lutidine], 140.1 ppm [para-CH-lutidine], 147.4 ppm [ortho CH-lutidine].

Figure 9:
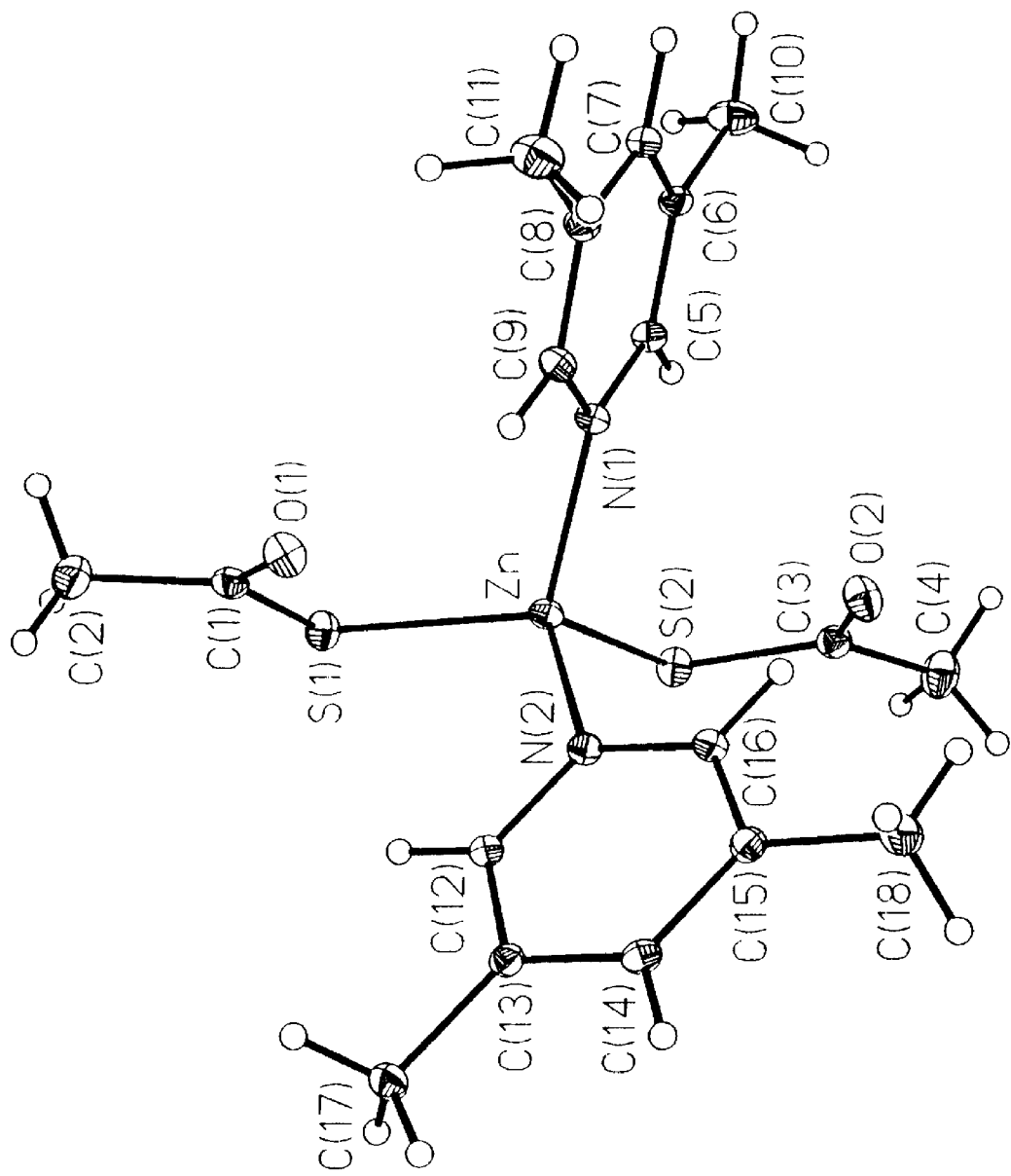
FIG. 9 shows the crystal structure of $3,5-Lu_2.Zn(SAc)_2$ in the solid state.

Single crystal X-ray diffraction was used to determine the structure of the compound (see FIG. 9).

Cd(SOCC(CH$_3$)$_3$)$_2$TMEDA

Cadmium carbonate (1 g, 5.80 mmol) and TMEDA (0.673 g, 5.80 mmol) and 20 mL toluene were combined in a round-bottom flask. Thiopivalic acid (1.5 mL, 11.82 mmol) were dropped into the mixture while stirring rapidly. The reaction took place immediately, noted by the disappearance of the solid cadmium carbonate and CO$_2$ bubble formation. The resulting clear solution took on a yellow color. Since decomposition of the reaction product to CdS was observed after a few min., the reaction mixture was stirred for only 15 min. before filtering out the precipitate. The toluene and volatile byproducts of the reaction (water) were removed under reduced pressure, and a glassy, creamy solid remained. The solid was redissolved in pentane and crystallized as long colorless needles at 0° C. Yield: 2.2 g (82% based on Cd).

Elemental analysis: Calculated: 41.5% C, 7.35% H and 6.06% N; found: 41.33% C, 7.31% H and 5.95% N.

TGA: The sample of Cd(SOCC(CH$_3$)$_3$)$_2$TMEDA decomposed in one step around 150°–200° C. with 30% wt. remaining (MW (CdS)/MW (Cd(SOCC(CH$_3$)$_3$)$_2$TMEDA)×100=31%. The inorganic residue in the TGA pan was identified as hexagonal CdS by powder X-ray diffraction.

$^1$H NMR data (C$_6$D$_6$): 1.39 ppm [18H, SOCC(CH$_3$)$_3$], 1.82 ppm [4H, C$_2$H$_4$-TMEDA, $^3$J-$^{113}$Cd-$^{111}$Cd=4.3 Hz (area of satellites =25% of major peak)], 2.05 ppm [12H, CH$_3$-TMEDA, $^3$J-$^{113}$Cd-$^{111}$Cd =4.5 Hz (area of satellites =25% of major peak)].

$^{13}$C NMR data: 29.5 ppm [SOCC(CH$_3$)$_3$], 46.2 ppm [CH$_3$-TMEDA], 47.3 ppm [SOCC(CH$_3$)$_3$], 56.7 ppm [C$_2$H$_4$-TMEDA].

$^{113}$Cd NMR: 335.6 ppm.

Cd(SOCC(CH$_3$)$_3$)$_2$Lu$_2$ (Lu=3,5-lutidine)

Cadmium carbonate (1 g, 5.80 mmol) and lutidine (1.24 g, 11.60 mmol) and 20 mL toluene were combined in a round-bottom flask. Thiopivalic acid (1.5 mL, 11.82 mmol) were dropped into the mixture while stirring rapidly. The reaction took place slowly; after approximately 40 min., the solution become clear and yellow, and evolution of CO$_2$ was observed. Reaction was stirred for 2 more hours at RT. Toluene and volatile byproducts of the reaction (water) were removed under reduced pressure, and a glassy, white solid remained. The solid was redissolved in toluene and pentane was introduced slowly by gas phase diffusion. After 4 days, the product crystallized as long, colorless blades. Yield: 2.2 g (68% based on Cd).

Elemental analysis: Calculated: 51.4% C, 6.42% H and 5.00% N; found: 51.29% C, 6.60% H and 4.88% N.

TGA: The sample of Cd(SOCC(CH$_3$)$_3$)$_2$Lu$_2$ decomposed in one step around 1502 C. with 27% wt. remaining (MW (CdS)/MW (Cd(SOCC(CH$_3$)$_3$)$_2$Lu$_2$)×100=26%. The inorganic residue in the TGA pan was identified as well crystallized hexagonal CdS by powder X-ray diffraction.

$^1$H NMR data (C$_6$D$_6$): 1.50 ppm [18H, SOCC(CH$_3$)$_3$], 1.65 ppm [12H, CH$_3$-lutidine], 6.47 ppm [2H, lutidine para-CH], 8.53 ppm [4H, lutidine ortho—CH].

$^{13}$C NMR data: 17.8 ppm [CH$_3$-lutidine], 29.6 ppm [SOCC(CH$_3$)$_3$], 47.9 ppm [SOCC(CH$_3$)$_3$], 134.0 [C—CH$_3$-lutidine], 138.4 ppm [para-CH-lutidine], 147.5 ppm [ortho CH-lutidine].

$^{113}$Cd NMR data: 338.6 ppm.

Zn(SOCC(CH$_3$)$_3$)$_2$Lu$_2$

Diethyl zinc (1 g, 8.1 mmol), lutidine (1.73 g, 16.2 mmol) and 20 mL toluene were combined in a round-bottom flask in an inert atmosphere box. The flask was removed from the inert atmosphere box and placed in a dry ice-acetone bath. Thiopivalic acid (2.06 mL, 16.2 mmol) was added to the solution via a pipette while stirring. The pale yellow solution was warmed to RT while stirring for several hours, and placed in a freezer for crystallization. Large, blocky colorless crystals formed overnight.

Elemental analysis: Calculated: 56.1% C, 7.01% H and 5.45% N; found: 56.09% C, 7.12% H and 5.37% N.

TGA: The sample of $Zn(SOCC(CH_3)_3)_2Lu_2$ decomposed in one step around 200° C. with 20% wt. remaining (MW (CdS)/MW $(Cd(SOCC(CH_3)_3)_2Lu_2) \times 100 = 19\%$. The inorganic residue in the TGA pan was identified as poorly crystalline hexagonal or cubic ZnS by powder X-ray diffraction.

$^1$H NMR data ($C_6D_6$): 1.40 ppm [18H, $SOCC(C\underline{H}_3)_3$], 1.65 ppm [12H, $C\underline{H}_3$-lutidine], 6.51 ppm [2H, lutidine para—CH], 8.69 ppm [4H, lutidine ortho—CH].

$^{13}$C NMR data: 17.8 ppm [$\underline{C}H_3$-lutidine], 29.3 ppm [$SOCC(\underline{C}H_3)_3$], 48.2 ppm [$SOCC\ (\underline{C}H_3)_3$], 134.02 [$\underline{C}$—$CH_3$-lutidine], 140.1 ppm [para-$\underline{C}H$-lutidine], 147.3 ppm [ortho $\underline{C}H$-lutidine].

Figure 10:
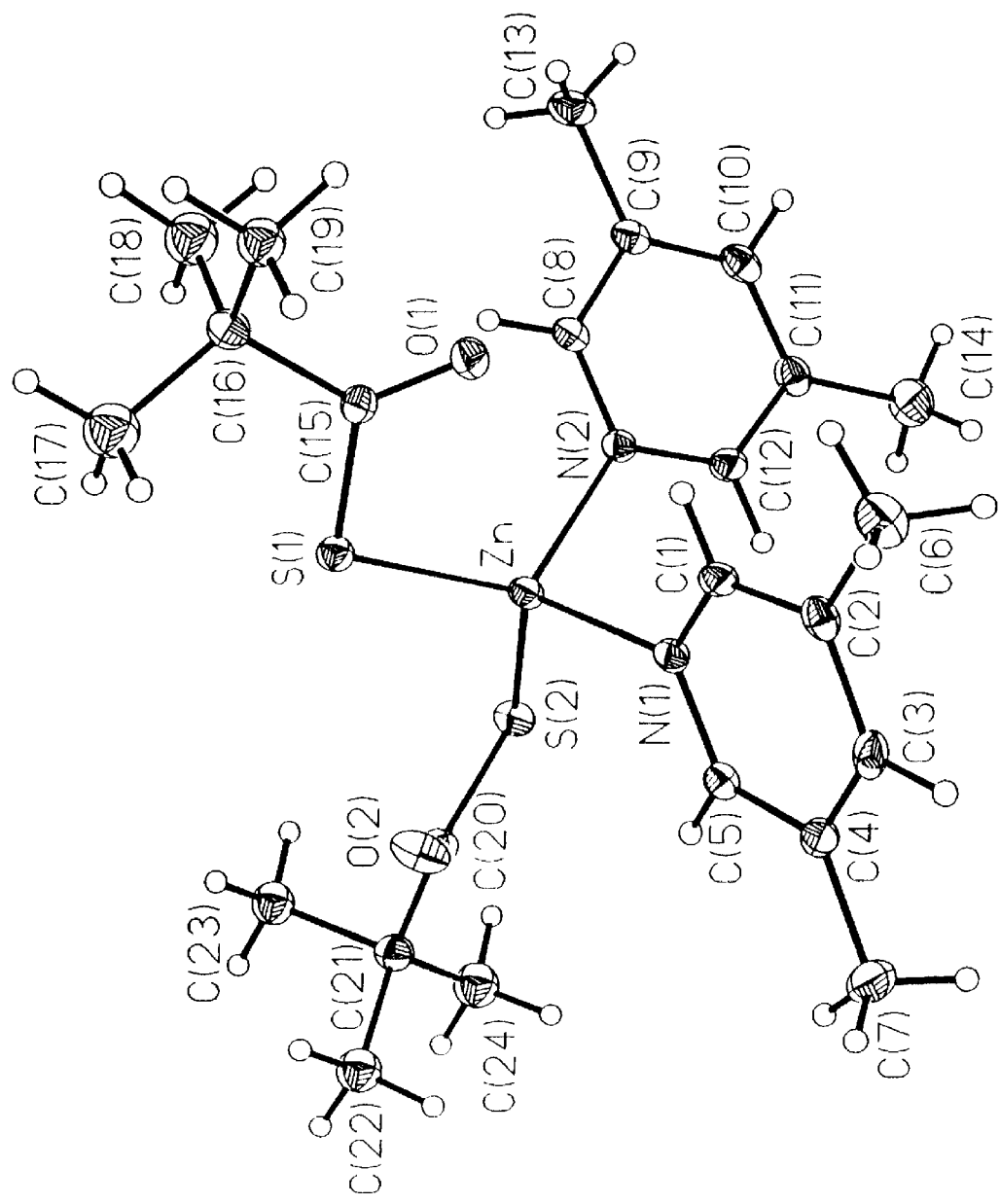
FIG. 10 shows the crystal structure of $Zn(SOCC(CH_3)_3)_2Lu_2$ in the solid state.

Single crystal x-ray diffraction was performed to determine the structure (see FIG. 10).

$Cd(SOCMe)_2 \cdot$ 18-crown-6

2 ml (28 mmol) thioacetic acid were added to a suspension of 2.42 g (14 mmol) $CdCO_3$ and 3.70 g (14 mmol) 18-crown-6 in 50 ml water. After stirring for 24 hrs most of the $H_2O$ had evaporated The product was extracted with 150 ml ethanol. Hot filtering produced a colorless filtrate. The solvent was removed under reduced pressure to give colorless crystals. Yield: 6.2 g (84%).

Elemental Analysis: Calc. for $C_{16}H_{30}O_8S_2Cd$ (MW 526.94): C: 36.47, H: 5.74; found: C: 36.34; H: 6.14.

$^1$H NMR (δ in ppm; $CD_3OD$): 2.39 (6H, s); 3.64 (24H, s); (δ in ppm); $C_6D_6$): 2.59 (6H, s); 3.47 (24H, s).

$^{13}C\{^1H\}$-NMR (δ in ppm; $C_6D_6$): 35.8 ($H_3C$—C(O)S, s); 69.7 (O—$CH_2$—$CH_2$—O, s); 225.0 ($H_3C$—C(O)S, s).

$^{113}Cd\{^1H\}$-NMR (δ in ppm; $C_6D_6$): 115.38 (s). $^{13}$C CP-MAS-NMR (d (ppm): 37.21 (s); 70.73 (s, br); 203.38 (s); 204.09 (s).

Synthesis of Group 13 Metal Compounds $[In(SOCMe)_4]^+[HNC_5H_3Me_2]^-$

To a clear benzene solution of $InEt_3$ (2.019 g, 0.001 Mol) in a glove box, an excess of thioacetic acid (3.245 g, 0.043 Mol) was added dropwise, slowly, and gas evolution was observed. To the above reaction solution, 2.0 mL of 3,5-dimethyl pyridine was dropped in to form a light yellow clear solution. The final light yellow clear solution was stirred for one day at RT under a nitrogen atmosphere. After the solvent was pumped out, a light yellow oily residue was formed. To this residue, 10.0 mL fresh benzene and 5 mL pentane were added and upon storing this solution in refrigerator at −5° C. for one day, the clear plate-shape crystals formed. After filtration, washing with pentane and pumping dry, 4.08 g (78% yield) final product was obtained.

$^1$H NMR(250 MHz, 20° C., pyridine-$d_5$): 2.12 ppm (s, 6H $C\underline{H}_3$ of 3,5-dimethyl pyridine), 2.39 ppm (s, 12H, $C\underline{H}_3$ of $In(SCOC\underline{H}_3)_4$), 7.18 ppm (s, 1H, 3,5-dimethyl pyridine), 8.40 ppm (s, 2H, 3,5-dimethyl pyridine).

$^{13}$C NMR (63 MHz, 20° C., pyridine-$d_5$): 18.06 ppm (s, $\underline{C}H_3$ of 3,5-dimethyl pyridine), 34.31 ppm (s, $\underline{C}H_3$ of In—SCO$\underline{C}H_3$), 132.92 ppm (s, 3,5-dimethyl pyridine), 137.43 ppm (s, 3,5-dimethyl pyridine), 147.69 ppm (s, 3,5-dimethyl pyridine), 205.54 ppm (s, $\underline{C}$O of In-S $\underline{C}OCH_3$).

Elemental analysis: Calc. for $InC_{15}H_{22}O_4S_4N$: C: 34.40, H: 4.20, N: 2.68. Found: C: 34.65, H: 4.20, N: 2.96.

Figure 11:
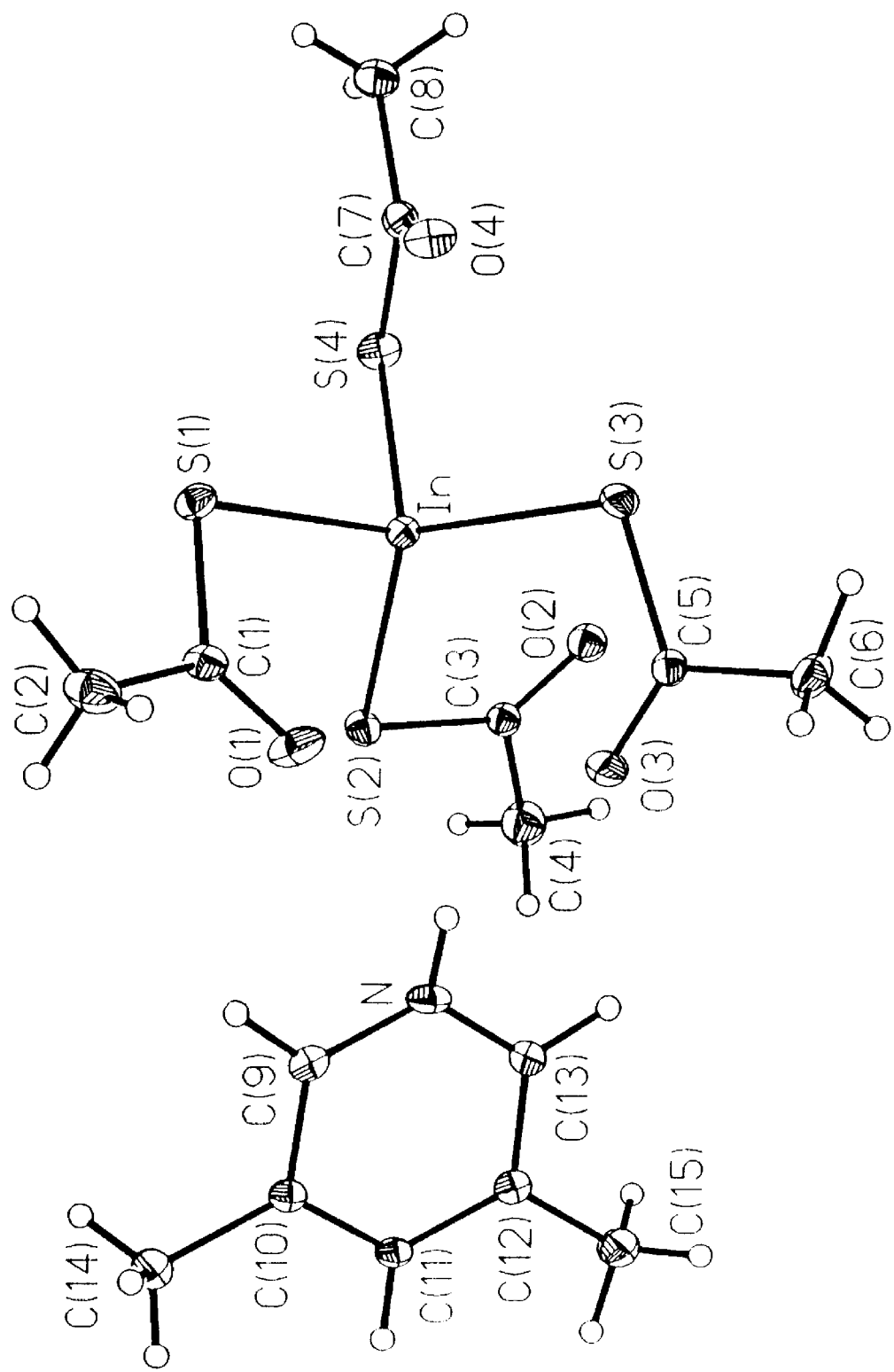
FIG. 11 shows the crystal structure of $3,5-Lu.In(SAc)_4$ in the solid state.

Single crystal X-ray diffraction was performed and the structure was solved by the Patterson method. SHELXL software used for all computations. (G. Sheldrick, Siemens, XRD, Madison, Wis., USA). The structure of this compound is shown in FIG. 11.

Synthesis of $LGa(SCOCH_3)_2Me$

To a clear toluene solution of $GaMe_3$ (0.576 g, 0.005 mol) in a glove box, thioacetic acid (1.15 g, 0.015 mol) was added dropwise slowly to form a light yellow clear solution. The release of gas bubbles was observed. To the above reaction solution, 1.0 mL of 3,5-dimethyl pyridine was dropped in. The final light yellow clear solution was stirred for one day at RT under a nitrogen atmosphere. After the solvent was pumped out, a light orange oily residue was formed. To this residue, 7.0 mL fresh pentane was added and upon storing this pentane solution at RT for one day, clear plate-shape crystals formed. After filtration, washing with pentane and pumping dry, 1.2 g final product was obtained (yield: 70%).

$^1$H NMR (250 MHz, 20° C., benzene-$d_6$): 0.97 ppm (s, 3H, Ga-$C\underline{H}_3$), 1.47 ppm (s, 6H, $C\underline{H}_3$ of 3,5-dimethyl pyridine), 2.19 ppm (s, 6H, $C\underline{H}_3$ of $Ga(SCOC\underline{H}_3)_2$), 6.31 ppm (s, 1H, 3,5-dimethyl pyridine, 8.55 ppm (s, 2H, 3,5-dimethyl pyridine).

$^{13}$C NMR (63 MHz, 20° C., benzene-$d_6$): −4.22 ppm (s, $\underline{C}H_3$ of Ga—$\underline{C}H_3$), 17.62 ppm (s, $\underline{C}H_3$ of 3,5-dimethyl pyridine), 34.82 ppm (s, $\underline{C}H_3$ of Ga-SC(O)$\underline{C}H_3$), 135.17 ppm (s, 3,5-dimethyl pyridine), 141.85 ppm (s, 3,5-dimethyl pyridine), 144.85 ppm (s, 3,5-dimethyl pyridine), 201.95 ppm (s, $\underline{C}$(O) of Ga—S$\underline{C}$(O)$CH_3$).

Elemental analysis: Calc. for $C_{12}H_{18}GaNO_2S_2$: C: 42.14, H: 5.27, N: 4.09. Found: C: 41.78, H: 5.41, N: 3.88.

Figure 12:
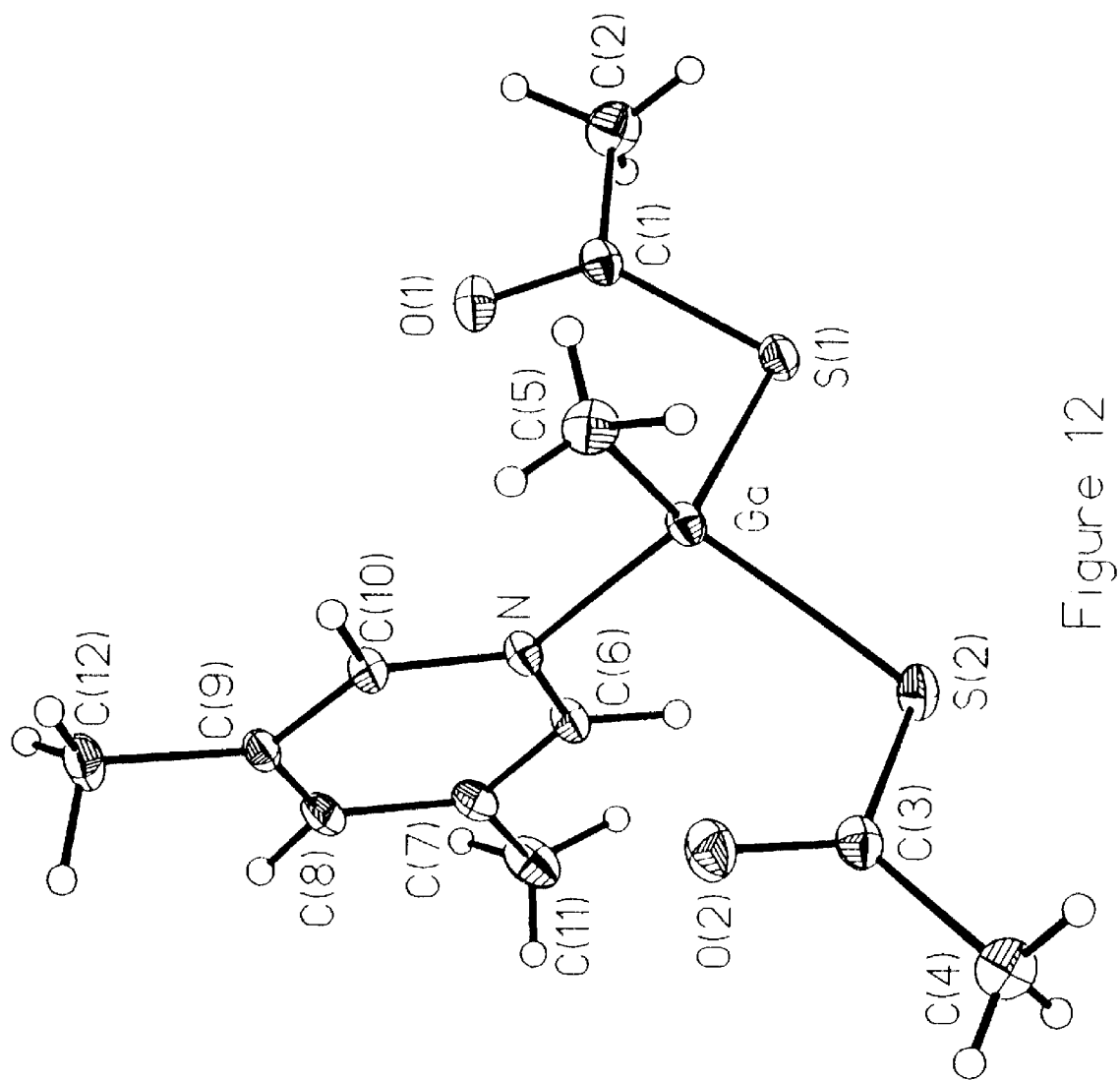
FIG. 12 shows the crystal structure of $3,5-Lu.Ga(SAc)_2(CH_3)$ in the solid state.

Single crystal X-ray diffraction was performed and the structure was solved by the Patterson method. SHELXL software used for all computations. (G. Sheldrick, Siemens, XRD, Madison, Wis., USA). FIG. 12 shows the structure of $LGa(SCOCH_3)_2(CH_3)$.

Synthesis of $LGa(SCOCH_3)_3$

The reaction was were carried out under a nitrogen atmosphere with dried and deoxygenated solvents. Triethyl gallium was used as purchased from Strem. Thioacetic acid (Aldrich) was purified by distillation.

The reaction was performed as described above for the synthesis of $LGa(SCOCH_3)_2Me$, except that recrystallization was achieved in the mixed solvents of benzene and pentane at 5° C. for 3 days. The final yield was 56% (1.12 g).

$^1$H NMR (250 MHz, 20° C., benzene-$d_6$): 1.52 ppm (s, 6H, $C\underline{H}_3$ of 3,5-dimethyl pyridine), 2.13 ppm (s, 9H, $C\underline{H}_3$ of $Ga(SCOC\underline{H}_3)_3$), 6.36 ppm (s, 1H, 3,5-dimethyl pyridine), 8.80 ppm (s, 2H, 3,5-dimethyl pyridine).

$^{13}$C NMR (63 MHz, 20° C., benzene-$d_6$): 17.70 ppm (s, $\underline{C}H_3$ of 3,5-dimethyl pyridine), 34.27 ppm (s, $CH_3$ of Ga-SCO$\underline{C}H_3$), 135.46 ppm (s, 3,5-dimethyl pyridine), 142.71 ppm (s, 3,5-dimethyl pyridine), 145.11 ppm (s, 3,5-dimethyl pyridine), 200.48 ppm (s, $\underline{C}$(O) of Ga-S $\underline{C}$(O)$CH_3$).

Elemental analysis: Calc. for $C_{13}H_{18}O_3S_3NGa$: C: 38.83, H: 4.48, N: 3.48; Found: C: 38.70, H: 4.58, N: 3.41.

Preparation of $[PySGa\ SCOCH_3)_3] \cdot Py$

The reaction was carried out under a nitrogen atmosphere with dried and deoxygenated solvents. Triethyl gallium was used as purchased from Strem. Thioacetic acid (Aldrich) was purified by distillation.

To a clear pentane solution of triethyl gallium (1.566 g, 0.01 mol) in a glove box, thioacetic acid (2.290 g, 0.003 mol) was added dropwise slowly. Upon addition of 15-crown-5 (2.390 g, 0.01 mol) to the reaction solution, a light yellow solid formed immediately. After stirring for 30 more min. in the glove box, the reaction flask was connected to a Schlenk line and was stirred at RT for 1 day. The crude yellow solid was filtered, washed with more fresh pentane and pumped dry. For recrystallization the above crude light yellow solid was then dissolved in 15 mL pyridine and left in a freezer at −30° C. The yield of final crystals was 1.5 g (53.2%).

$^1$H NMR (250 MHz, 20° C., Benzene-$d_6$): 2.08 ppm (s, br. 9H, Ga(SOCCH$_3$)), 6.52 ppm (s, 8H, Py), 6.80 ppm (s, 4H, Py), 8.90 ppm (s, 8H, Py).

$^{13}$C NMR (63 MHz, 20° C., benzene-$d_6$): 34.17 ppm (s) &34.57 ppm(s, $\underline{C}H_3$ of Ga(SCOCH$_3$)), 124.03 ppm(s, Py), 137.56 ppm(s, Py), 149.19 ppm(s, Py), 199.73 ppm (s, $\underline{C}O$ of Ga(SCOCH$_3$)).

Elemental Analysis: Calc. for [PySGa(SCOCH$_3$)]$_3$.Py: C: 36.90, H: 3.43, N: 6.62. Found: C: 37.56, H: 3.99, N: 6.49.

Figure 13:
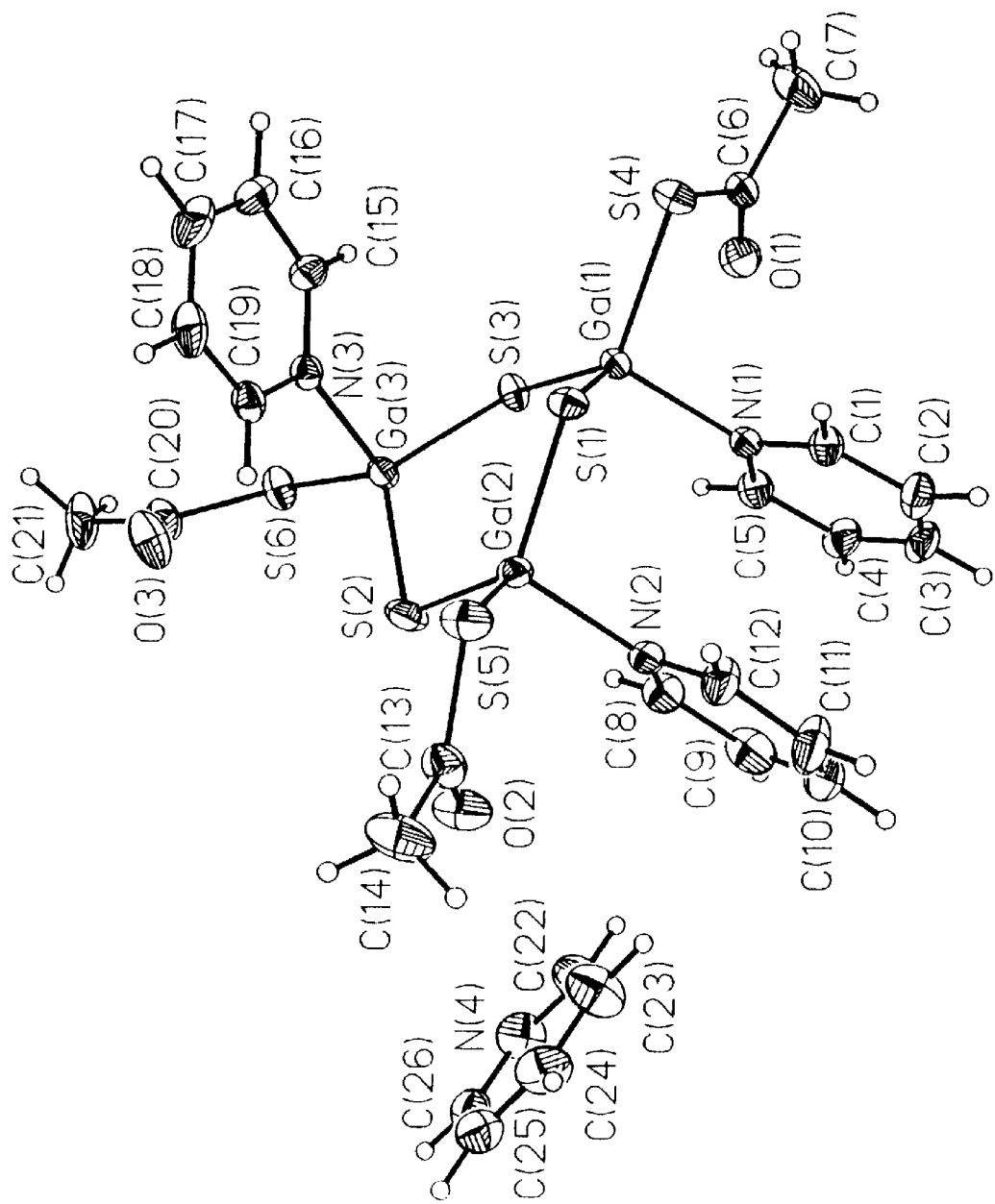
FIG. 13 shows the crystal structure of $[PySGa(SAc)]_3.Py$ in the solid state.

Single-crystal X-ray diffraction was performed and the structure was solved by the Patterson Method. SHELXL software used for all computations. (G. Sheldrick, Siemens XRD, Madison, Wis., USA). FIG. 13 shows the structure of [PySGa(SCOCH$_3$)]$_3$.Py.

Synthesis and Characterization of Group 14 Metal Compounds

[($^t$BuO)Sn(SOCMe)]$_2$ 1.04 g (1.96 mmol) [Sn(O$^t$Bu)$_2$]$_2$ were dissolved in 50 ml ether. 0.299 g (3.92 mmol) thioacetic acid was added at RT and the reaction solution stirred for 10 min. Immediate filtration resulted in a colorless solution. The volatiles were removed under vacuum and a colorless powder was obtained. Crystals could be grown in an ether solution at −30° C.

$^1$H NMR (δ in ppm; $C_6D_6$): 1.28 (9H, s); 2.25 (3H, s).

$^{13}$C{$^1$H}-NMR (δ in ppm; $C_6D_6$): 32.02 ((CH$_3$)$_3$—CO, s, $J^{13C-117/119Sn}$=21 Hz, 55% of the main signal); 35.97 (H$_3$C—C(O)S, s); 76.89 ((CH$_3$)$_3$—CO, s); 211.0 (H$_3$C—C(O)S, s).

$^{119}$Sn{$^1$H}-NMR (δ in ppm: $C_6D_6$): −70.11, s, $J^{119Sn-117Sn}$=80 Hz, 9.5% of the main signal.

Preparation of Pb(SAc)$_2$.18-crown-6

Method a): The reaction was carried out in nitrogen and in the absence of light. In a 200 ml Schlenk flask were added 1.95 g of PbCl$_2$, 1.6 g of KSAc, 1.85 g of 18-crown-6 and 50 ml THF. The solution was stirred for 12 h at RT, followed by the removal of the solvent under reduced pressure to leave a white solid with brown impurities. The crude product was recrystallized from an ethanol solution. Colorless crystals with brown impurities were formed.

Method b): The reaction was carried out under air. To a 100 ml beaker were added 7 mmol of PbCO$_3$, 7 mmol of 18-crown-6, 1.0 ml of HSAc (14 mmol) and 30 ml of distilled water. Crystalline PbS was obtained after stirring for several hours.

$^1$H NMR (methanol-$d_4$) of the crude product: 2.32 (s, 6H), 3.63 (s, 24H); $^{13}$C NMR (methanol-$d_4$): 35.8 (s), 69.7 (s), 71.1 (s); $^1$H NMR(methanol-$d_4$) of the recrystallized product: 2.32 (s, 6H), 3.63 (s, 24H).

Figure 14:
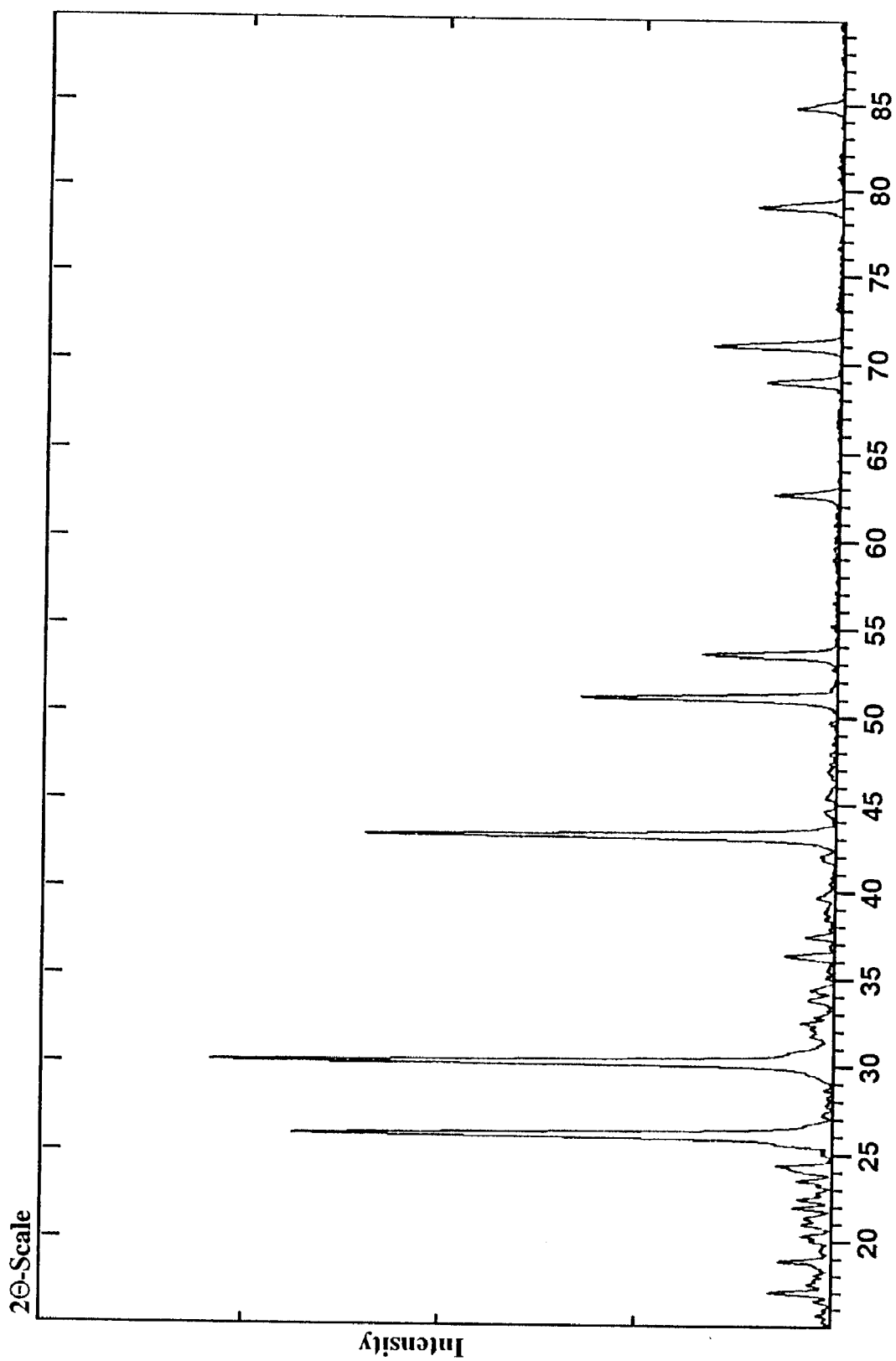
FIG. 14 shows powder X-ray diffraction data of PbS as formed by thermal decomposition of $Pb(SAC)_2.18$-crown-6.
Figure 15:
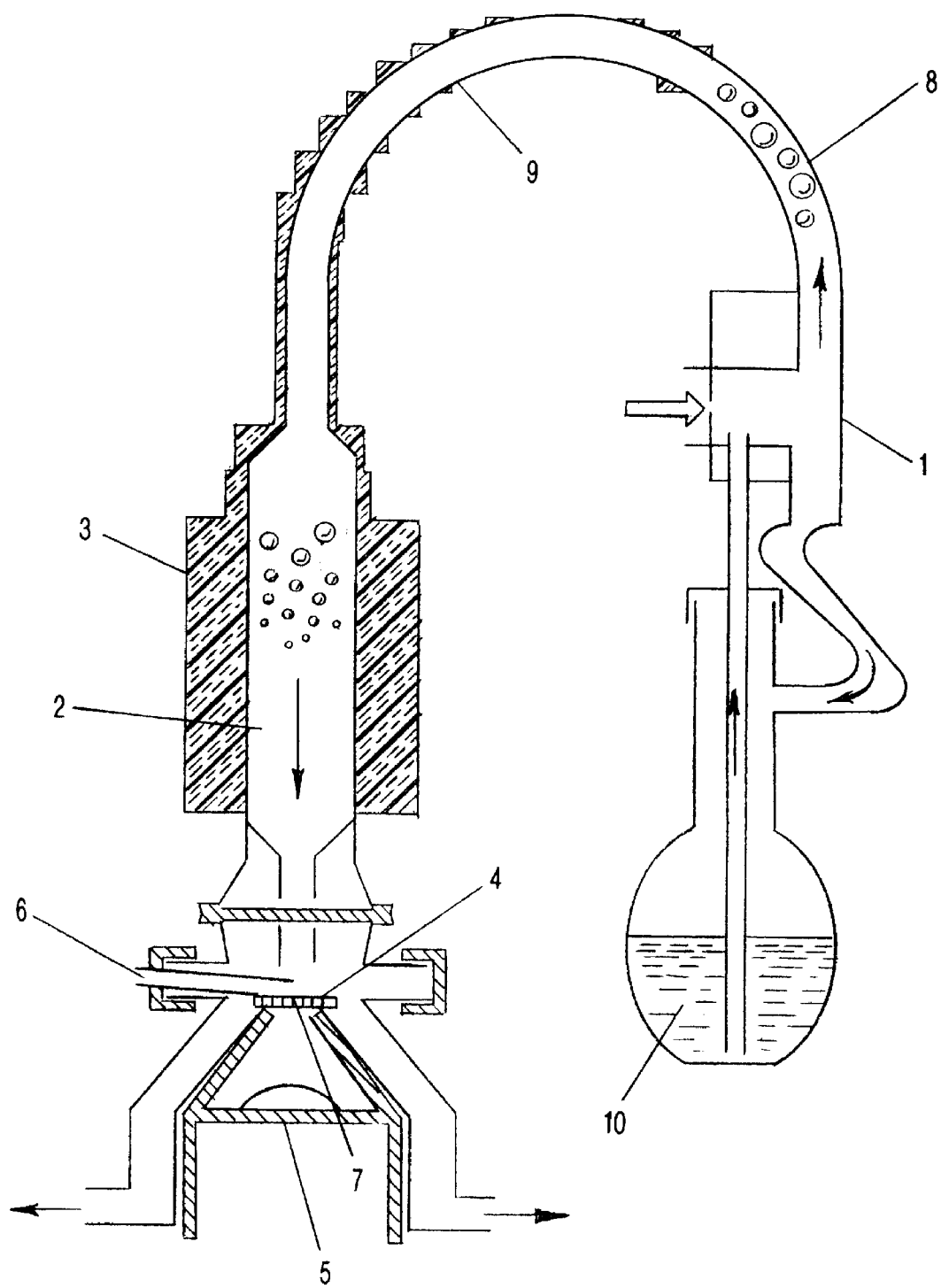
FIG. 15 shows an AACVD apparatus used in the present invention.
Figure 16:
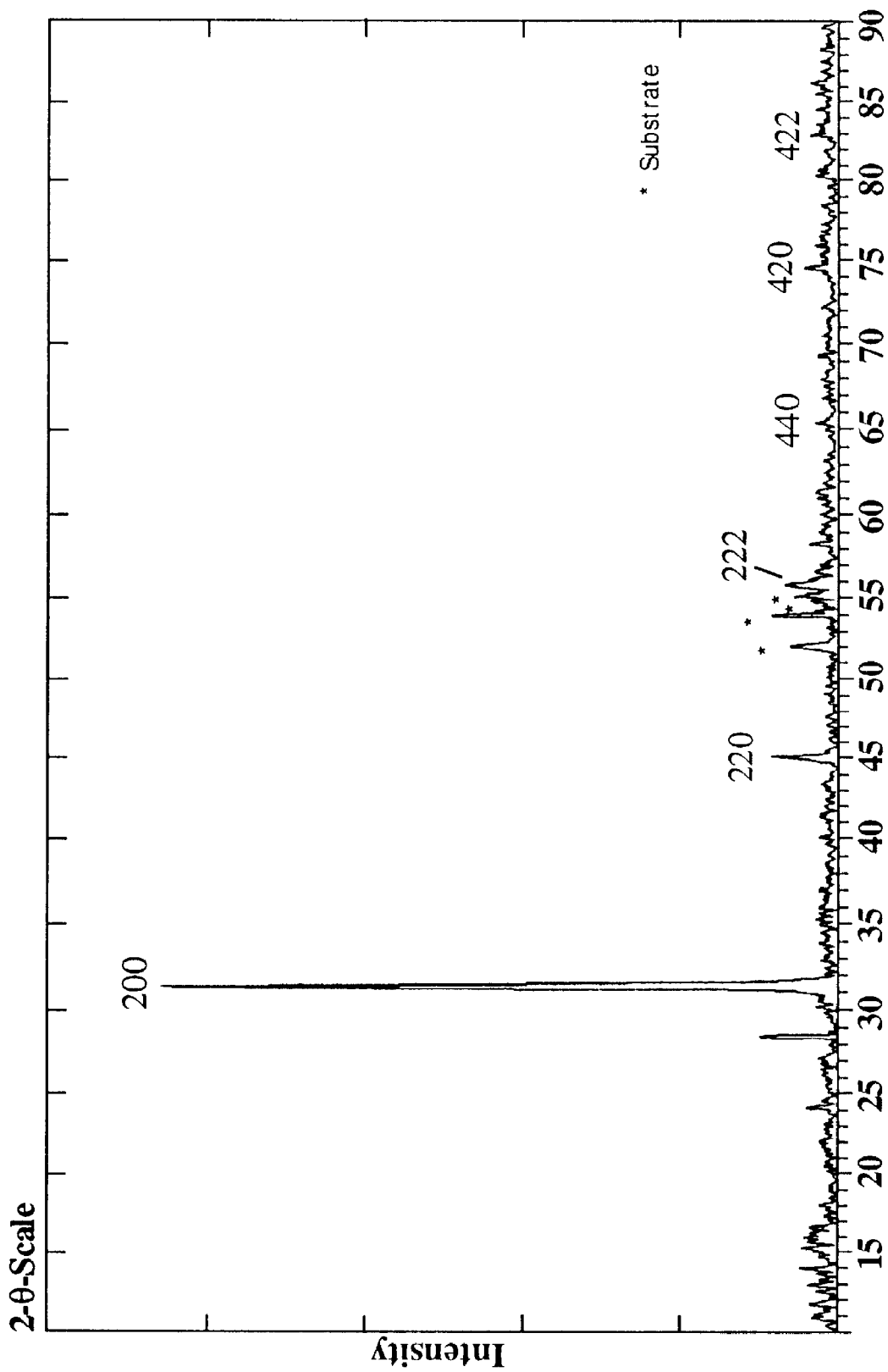
FIG. 16 shows powder X-ray diffraction data for CaS as formed by thermal decomposition of $Ca(SAc)_2.15$-crown-5.

The thermal decomposition of Pb(SAc)$_2$.18-crown-6 in nitrogen produced crystalline PbS (see powder X-ray diffraction analysis of FIG. 14).

[Pb(SOCMe).18-crown-6]$^+$[Pb(SOCMe)$_3$]$^-$ 1.87 g (7 mmol) PbCO$_3$ and 1.85 g (7 mmol) 18-crown-6 were suspended in 40 ml of dist. water. 1 ml (14 mmol) thioacetic acid was added through a pipette under the solution surface to avoid possible formation of brownish black impurities. After the evolution of CO$_2$ had ceased (ca. 5 min.), the solution was stirred for an additional 20 min. The product was collected on filter paper by filtering through a Büchner funnel. It was washed with 5 ml H$_2$O five times. After drying under vacuum the yield of the crude crystalline product was 2.73 g (80% based on 18-crown-6). Colorless needles were isolated by recrystallization from ethanol. The final yield was 2.38 g (69.4%).

Elemental Analysis: Calc. for $C_{20}H_{36}O_{10}S_4Pb_2$ (MW 979.14): C: 24.53, H: 3.71; found: C: 24.43, H: 3.91.

$^1$H NMR (δ in ppm; CD$_3$OD): 2.33 (12H, s); 3.80 (24, s).

$^{13}$C{$^1$H}-NMR (δ in ppm; CD$_3$OD): 39.0 (H$_3$C—C(O)S, s); 71.5 (O—CH$_2$—CH$_2$—O, s); 215.6 (H$_3$C—C(O)S, s).

Deposition of Metal Sulfide Films by AACVD

Metal sulfide films were deposited by aerosol-assisted chemical vapor deposition (AACVD). Aerosol delivery of the precursors was chosen because, even though the polyether precursors are monomeric, their volatility (as demonstrated with the TGA experiments) is low and dissociation of the polyether ligand would be likely upon prolonged heating.

The apparatus used for AACVD comprises an aerosol generator 1, for example, TSI 3076 (produced by TSI, Saint Paul, Minn.), and cold-wall CVD reactor 2 of conventional design (schematically represented in FIG. 15) comprised of a preheating oven 3, a substrate chamber 4 and a heating means 5, for example, in the form of a lamp heater. The temperature of the substrate 7 is monitored with a thermocouple 6. The conduit 8 between the aerosol generator 1 and the preheating oven 3 is provided with a heating tape 9. A container 10 with the solution of the precursor in a suitable solvent, for example, ethanol, can be attached to the aerosol generator 1.

The respective precursor(s) were dissolved in ethanol and delivered via the aerosol generator in a stream of nitrogen into the CVD reactor.

The substrate temperature was varied between 250° C. and 600° C. The preheating temperature within the preheating oven was varied between 70° C. and 250° C. It was found that optimum conditions for most precursors were 310° C. substrate temperature and 150° C. preheating temperature.

The general procedure for carrying out the AACVD process was as follows: In a flask 10 the precursor was dissolved in a suitable solvent. The flask 10 was connected to the aerosol generator. Nitrogen at a pressure of 20 psi was guided through the aerosol generator in order to carry the precursor into the aerosol generator 1. The resulting precursor aerosol was guided via the conduit 8 into the preheating oven 3 kept at a suitable preheating temperature for vaporizing the aerosol and then into the substrate chamber 4. The substrate 7, for example, a silicon wafer, was heated to the desired reaction temperature. The sulfide film was formed on the substrate and byproducts were flushed out with the nitrogen stream.

It is also possible to use a combination of two or more precursors in order to produce mixed metal sulfide films. Preferred combinations are Ca/Ba and Ca/Sr. In these embodiments the precursors of different metals, for example, Ca(SaC)$_2$.L and Ba(SAc)$_2$.L are dissolved together in a solvent and placed into the container 10 from where they are together introduced into the aerosol generator and the CVD apparatus.

Another preferred mixed metal sulfide film is CaGa$_2$S$_4$ which is preferably produced by combining the precursors Ca(SAc)$_2$.L and Ga(SAc)$_3$. L.

In the following specific examples will be described.

Deposition of CaS from Ca(SAc)$_2$.15-crown-5

A 2.5% solution of Ca(SAc)$_2$.15-crown-5 in ethanol was prepared. The solution was delivered with nitrogen as an aerosol to the CVD reactor. The substrate temperature was varied between 250°–600° C. The preheating temperature was varied between 70°–250° C. The optimum conditions for the precursor were found to be 310° C. for the substrate and 150° C. for the preheating temperature.

The resulting CaS films were examined by X-ray powder diffraction analysis. The number and location of peaks confirmed that the produced film indeed was comprised of CaS (see FIG. 16).

Scanning electron microscope testing (SEM) confirmed the presence of a film of cube-shaped crystals and showed the thickness of the film to be approximately 100 nm.

Deposition of SrS thin films by AACVD

The compound $Sr(SOCMe)_2 \cdot 18$-crown-6 was dissolved in ethanol to give a 2 wt. % solution. The compound was delivered in a nitrogen stream to a cold wall CVD reactor. The substrate temperature was varied between 295° and 350° C., the preheating temperature between 90° and 170° C. Good deposition results were obtained at 300° C. for the substrate temperature and at 170° C. for the preheating temperature.

The x-ray powder pattern shows peaks for SrS. There is a slight orientation during film deposition.

Deposition of $Ca_xSr_{1-x}S$ thin films by AACVD $Ca(SOCMe)_2 \cdot 15$-crown-5 and $Sr(SOCMe)_2 \cdot 18$-crown-6 were dissolved in equimolar ratio in ethanol to give a 2.6 wt. % solution. The compounds were delivered in a nitrogen stream to a cold wall CVD reactor. The substrate temperature was varied between 250° and 310° C., the preheating temperature between 80° and 200° C.

The x-ray powder pattern shows peaks for the solid solution of $Ca_xSr_{1-x}S$ with x=0.35.

ZnS, CdS and $Zn_xCd_{1-x}S$ Films from $M(SOCR)_2TMEDA_2$

Precursor solutions in toluene of 0.1–0.3 mmol concentration were prepared of $Zn(SOCR)_2TMEDA_2$ and $Cd(SOCR)_2TMEDA_2$. The precursor solutions were introduced into the apparatus individually or as mixtures of various Zn/Cd ratios and deposited onto silicon Excil wafers.

In the case of the individual precursors the substrate was heated to 100°–200° C. for Zn and 125°–250° C. for Cd. The preheating zone was heated to 80° C., and the nitrogen carrier gas flow rate was 2 L/min.

Figure 17:
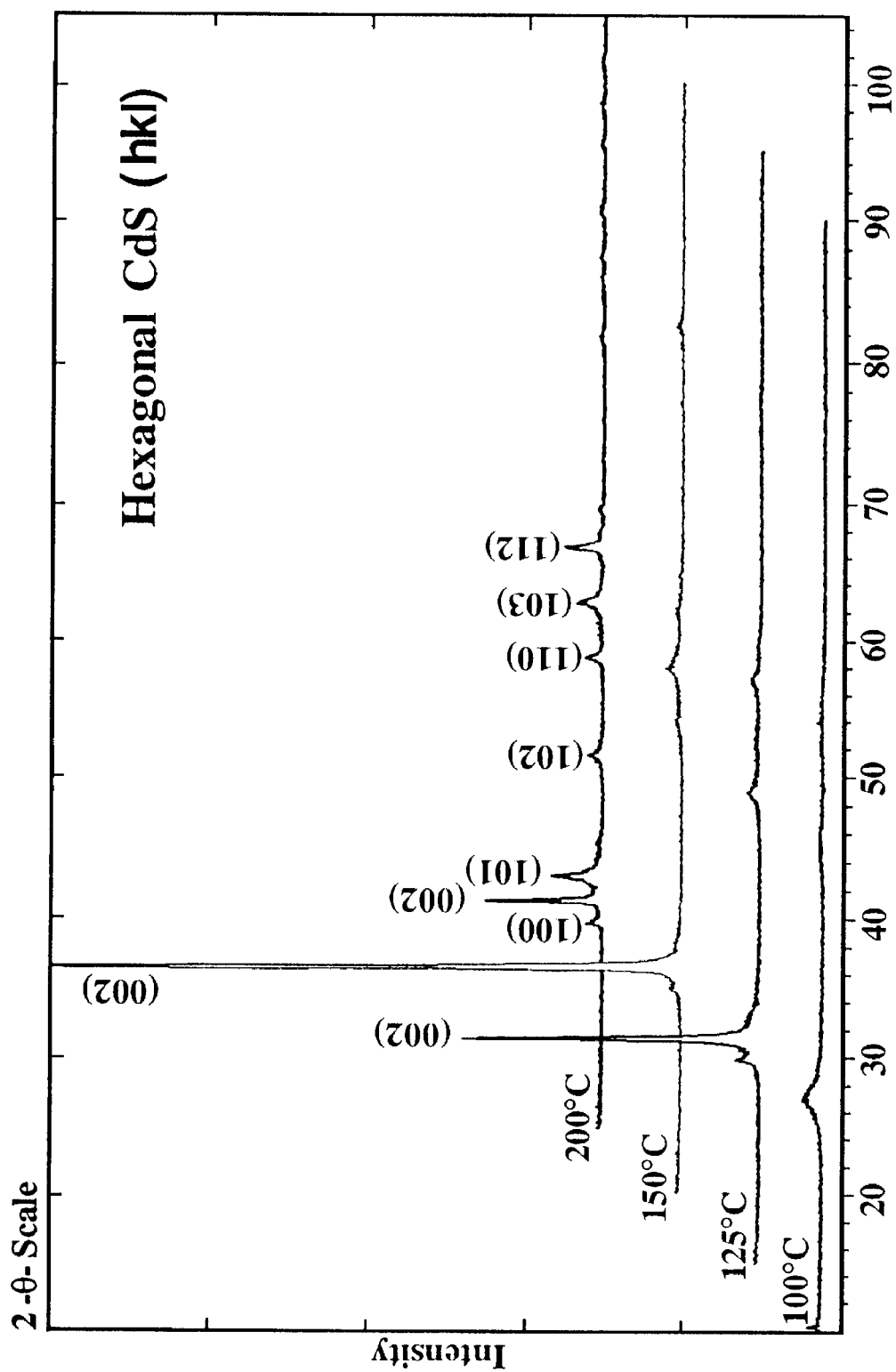
FIG. 17 shows X-ray diffraction data of CdS films from $Cd(SAc)_2.TMEDA$.
Figure 18:
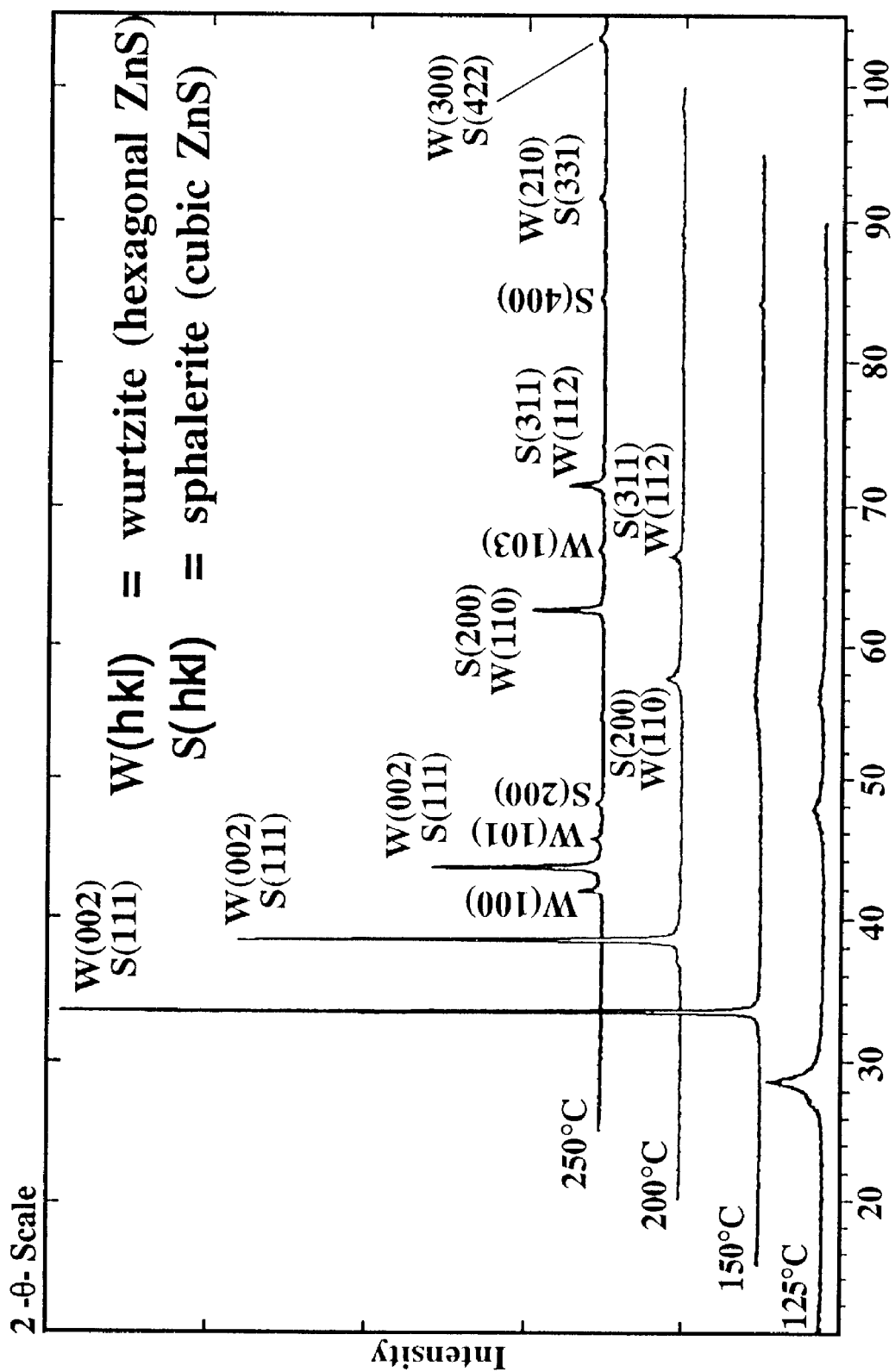
FIG. 18 shows X-ray diffraction data of ZnS films from $Zn(SAc)_2.TMEDA$.
Figure 19A:
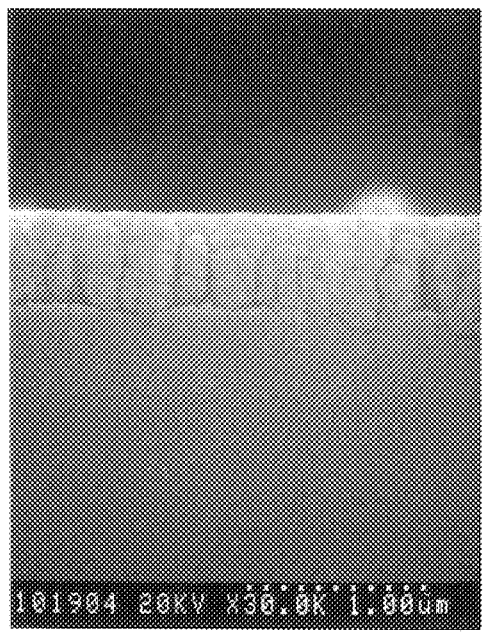
FIGS. 19a and 19b show SEMs of a CdS film.
Figure 19B:
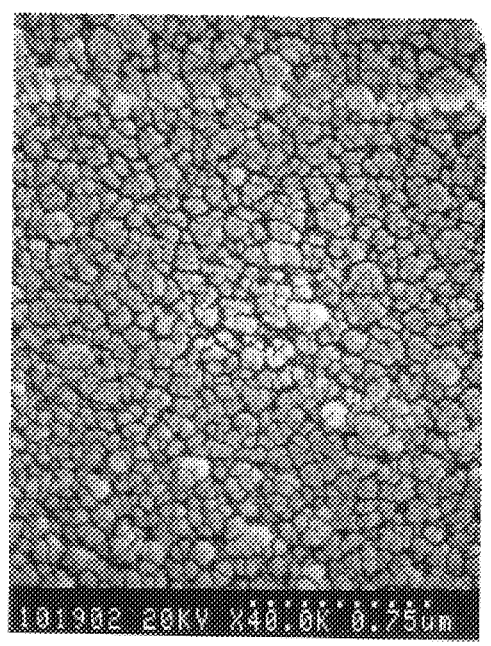
Figure 20A:
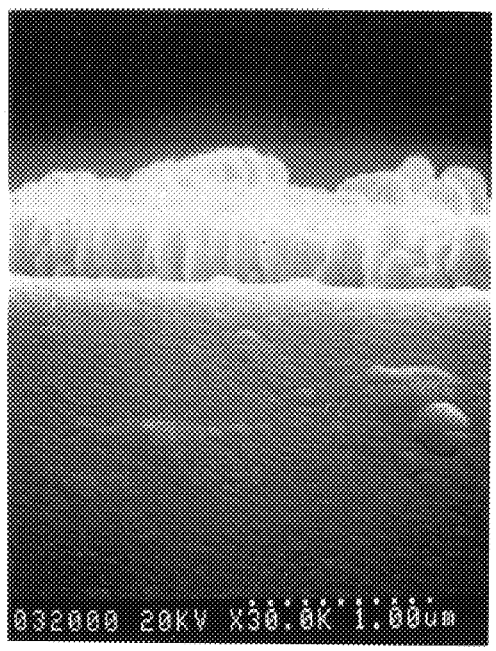
FIGS. 20a and 20b show SEMs of a ZnS film.
Figure 20B:
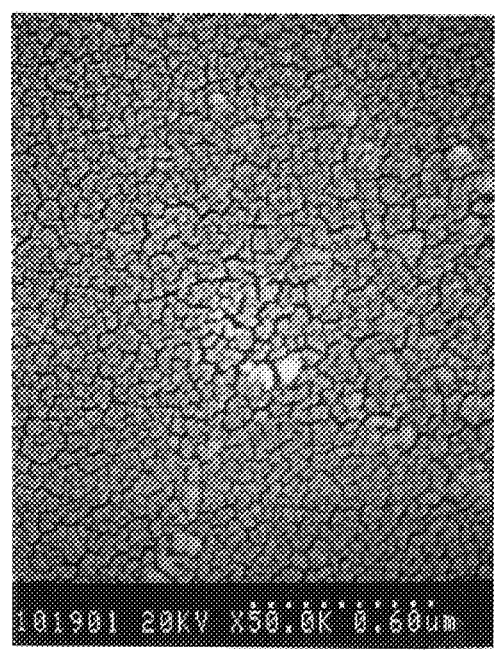

Glancing angle X-ray diffraction of the CdS and ZnS films are shown in FIGS. 17 and 18, respectively. The CdS films are hexagonal, preferentially (002) oriented, with increasingly random orientation at 200° C. substrate temperature. The crystal structures of the ZnS films are somewhat ambiguous. The predominant peak in all the films located at 2q=28.5° (d=3.123 Å) corresponds with the (111) reflection of cubic zinc sulfide or the (002) reflection of hexagonal zinc sulfide. Therefore the ZnS film deposited at 150° C. is either (002) oriented wurtzite or (111) oriented sphalerite. Two additional peaks which are seen in the diffraction patterns of films deposited at 200°–250° C. correspond to the (220) and (311) reflections of sphalerite or the (110) and (112) reflections of wurtzite. Additionally, the (103), (100) and (101) reflections of wurtzite and the (200) reflection of sphalerite, which are unique to each phase, respectively, are also observed in the spectrum of the film deposited at 250° C. Therefore it is difficult to unambiguously determine the phase of the highly oriented films deposited below 200° C., and films deposited at 200°–250° C. are presumed to be a mixture of preferentially (111) oriented sphalerite and preferentially (002) oriented wurtzite. SEM pictures (FIG. 19a–b, FIG. 20a–b) of typical films revealed columnar growth, grain size around 60–100 nm, and film thickness of ~0.5 mm, which corresponds with deposition rates of ~100–150 Å/min. The films were pure within the detection limits of electron microscope analysis.

Finally, CVD of $Cd_{1-x}Zn_xS$ was carried out in order to determine the ability to vary the stoichiometry of the ternary phase by varying the stoichiometry of the precursor solution. The $Cd_{1-x}Zn_xS$ films were deposited using the following deposition parameters; 175° C. substrate temperature, 80° C. preheating temperature, 0.1–0.3 mmol solutions of $Cd(SOCCH_3)_2TMEDA$ and $Zn(SOCCH_3)_2TMEDA$ mixed in Cd:Zn ratios of 6:4, 5:5, 4:6, and 2.5:7.5.

Figure 21:
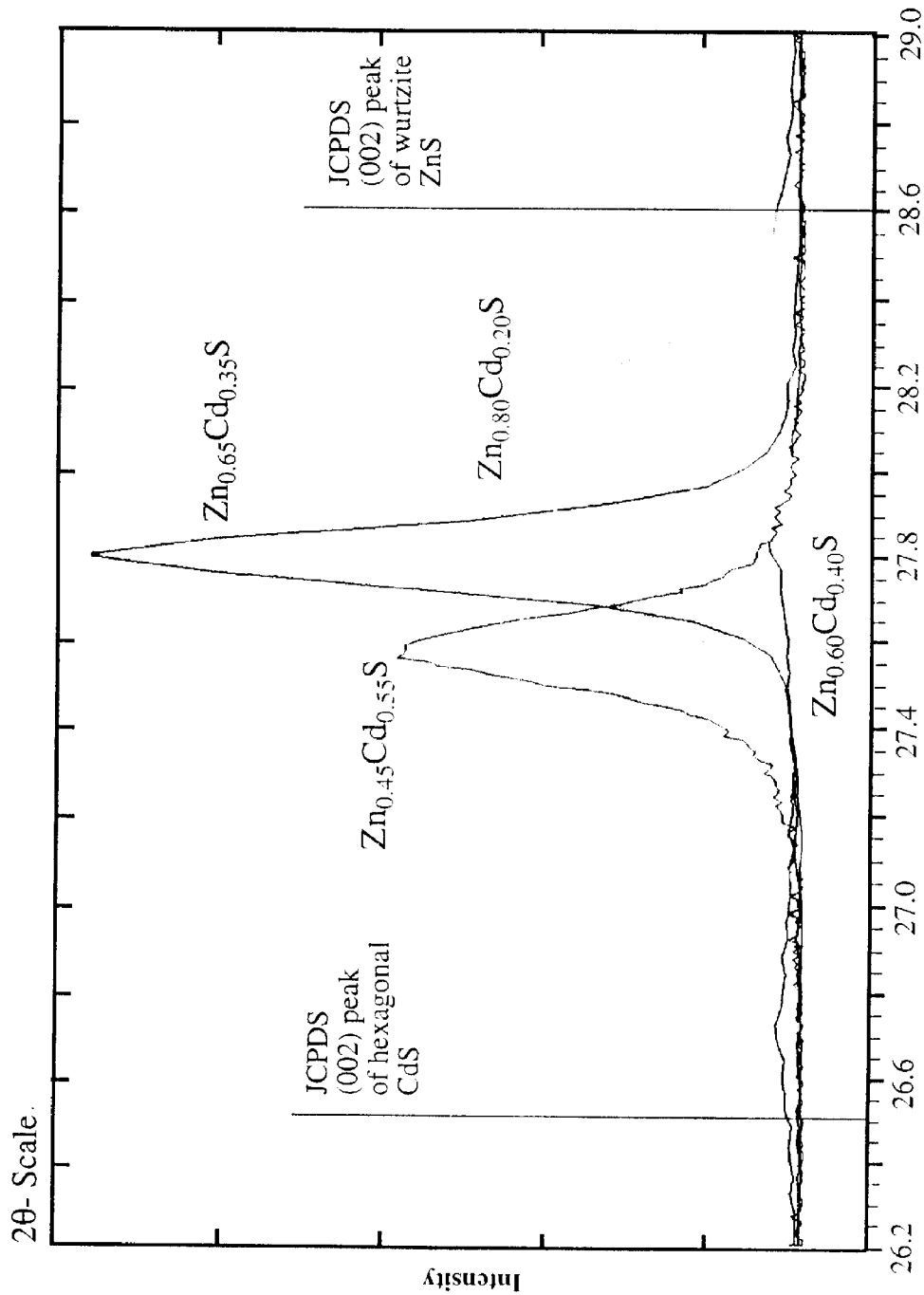
FIG. 21 shows X-ray diffraction data for $Zn_xCd_{1-x}S$ films of various compositions.

Films deposited from these solutions have similar growth rates and morphologies as the CdS and ZnS films, and are (002) oriented hexagonal phase. FIG. 21 shows the (002) peaks of the $Cd_{1-x}Sn_xS$ films and their composition as determined by electron microprobe analysis, along with JCPDS (002) peak positions of the CdS and ZnS end members. The increase in (002) d-spacing with increasing Cd content is consistent with the formation of a solid solution, and these (002) d-spacing values agree with theoretical values calculated from Vegard's Law for solid solutions. Also, binary phases ZnS and CdS are not apparent by X-ray diffraction.

As a general trend it was observed that the films were Cd-deficient compared to the solutions by 5–10 atomic % under these deposition conditions.

Deposition of CdS thin films by AACVD The compound $[(^tBuO)Cd(SOCMe)]_4$ was dissolved in ether to give a 1.5 wt. % solution. The compound was precooled to −20° to 0° C. and delivered in a nitrogen stream to a cold wall CVD reactor. The substrate temperature was varied between 85° and 195° C., the preheating temperature between 50° and 70° C. Thin films were produced at temperatures between 100° and 195° C. Only particles were formed at substrate temperatures below 100° C. Thin films produced at substrate temperatures between 100° and 155° C. are accompanied by some particle deposition.

The x-ray powder pattern shows peaks that can be assigned to the hexagonal phase of CdS (Greenockite). Whether the peaks in the XRD spectra for the thin film obtained at 120°–125° C. substrate temperature correspond to an oriented Greenockite phase or the cubic Hawleyite phase is not conclusive.

Deposition of $In_2S_3$ from $[In(SOCMe)_4]^{30}$ $[HNC_5H_3Me_2]^-$ 1.2 g of $[In(SOCMe)_4]^+[HNC_5H_3Me_2]^-$ was dissolved in 40 mL THF (0.06 M) forming a light yellow clear solution. $T_{substrate}$=210° C., $T_{preheating}$=70° C., $T_{tape\ (preheating)}$=50° C. Carrier gas: $N_2$ at 20 psi. Time 60 min. The rate of deposition was about 28 nm/min.

Figure 22:
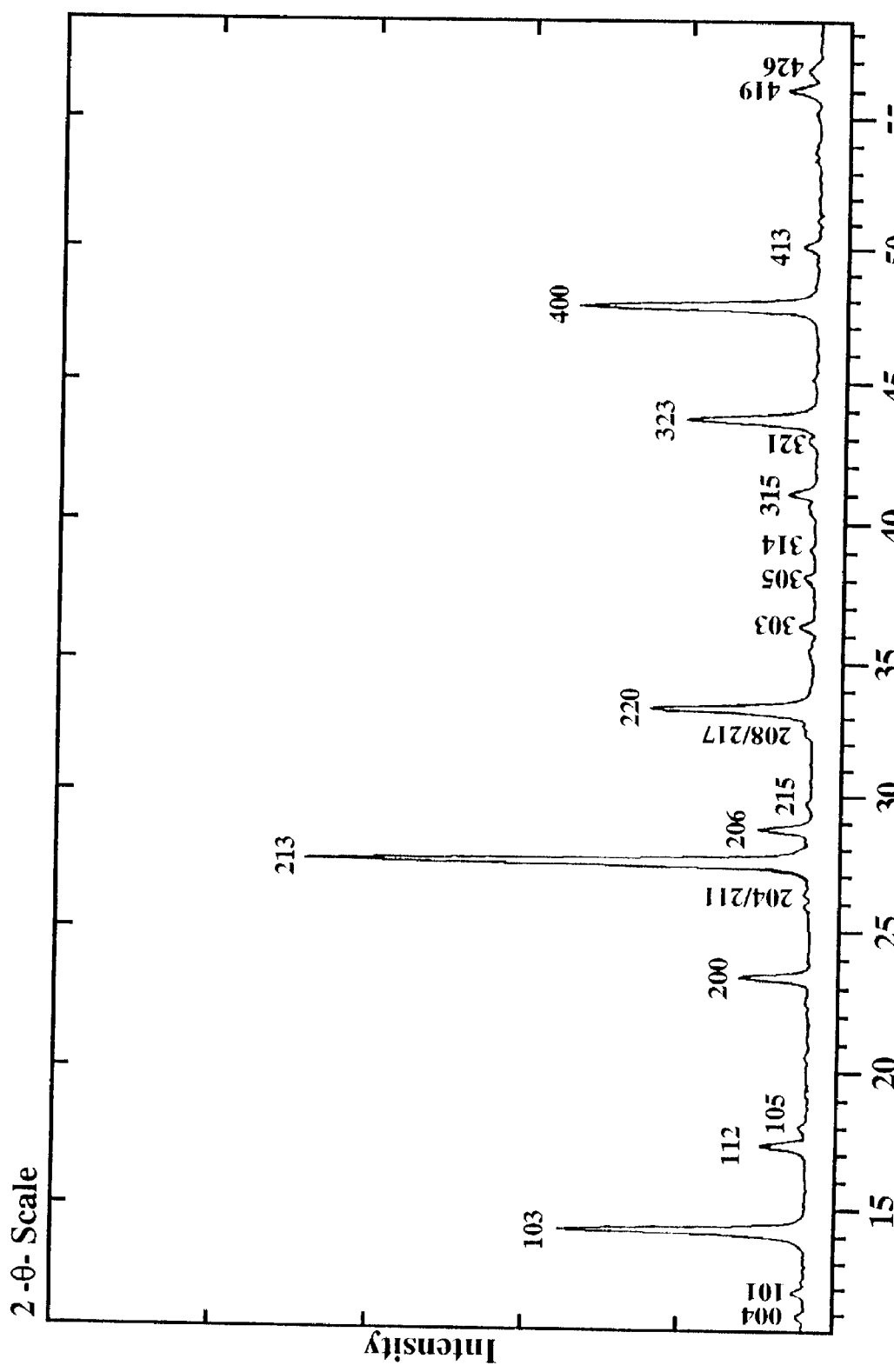
FIG. 22 shows powder X-ray diffraction data of $In_2S_3$ film deposited at 210° C.
Figure 23A:
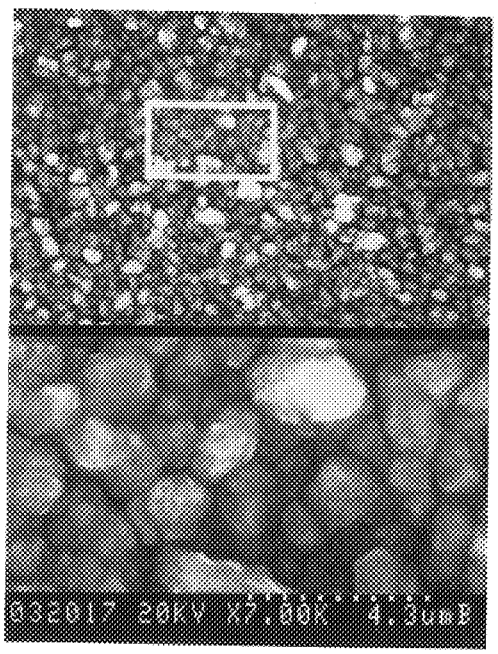
FIGS. 23a and 23b show SEMs of an $In_2S_3$ film.
Figure 23B:
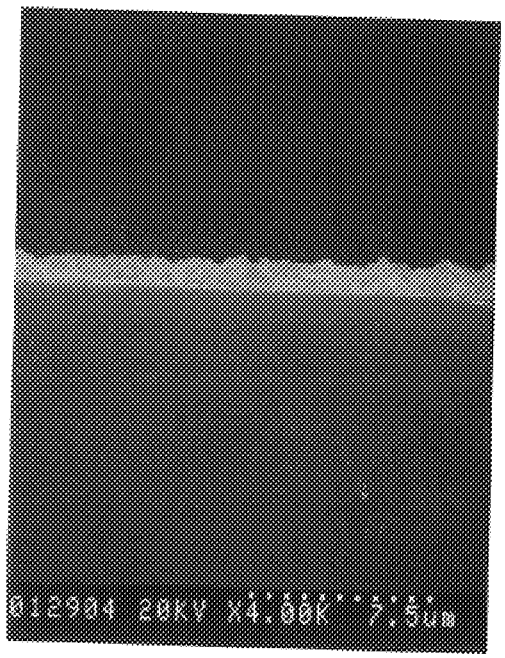

Powder X-ray diffraction spectrum of the $In_2S_3$ film is shown in FIG. 22 and SEM picture is shown in FIG. 23.

Deposition of $Ga_2S_3$ from $LGa(SCOCH_3)_2Me$ (L=3,5-dimethyl pyridine)

Figure 24:
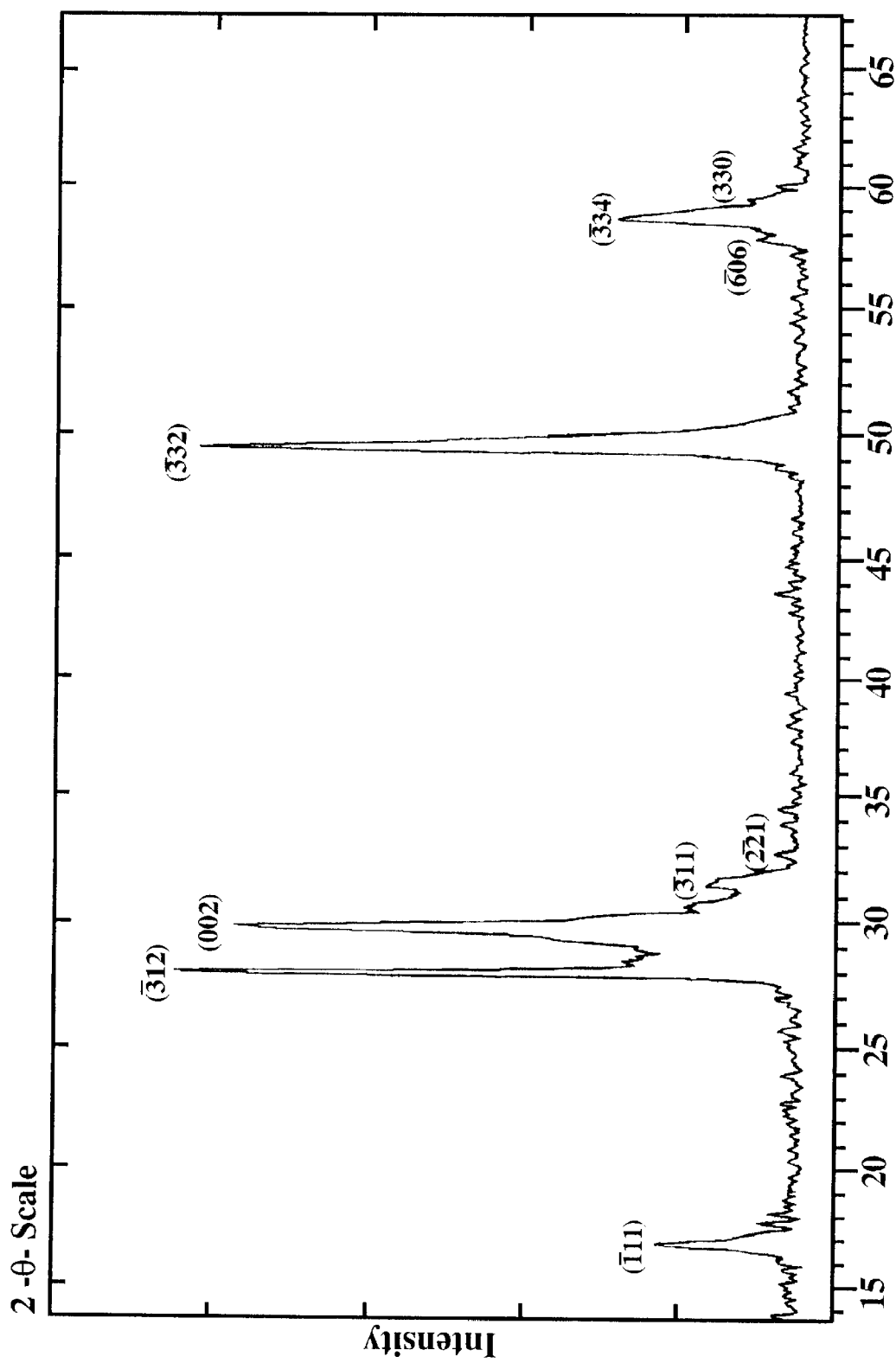
FIG. 24 shows powder X-ray diffraction data of $Ga_2S_3$ film deposited at 275° C.
Figure 25A:
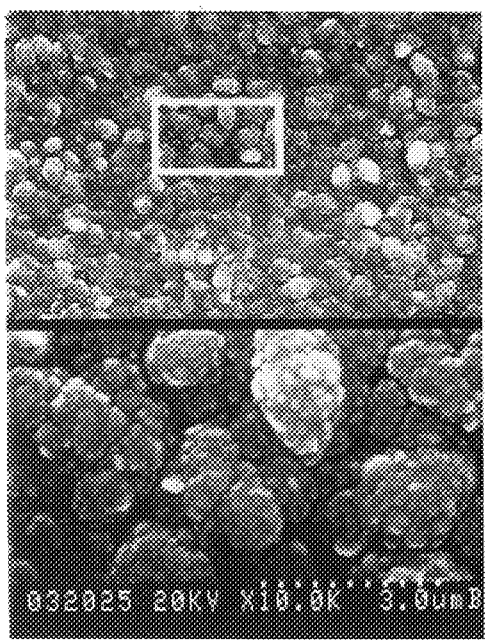
FIG. 25 show SEMs of a $Ga_2S_3$ film.
Figure 25B:
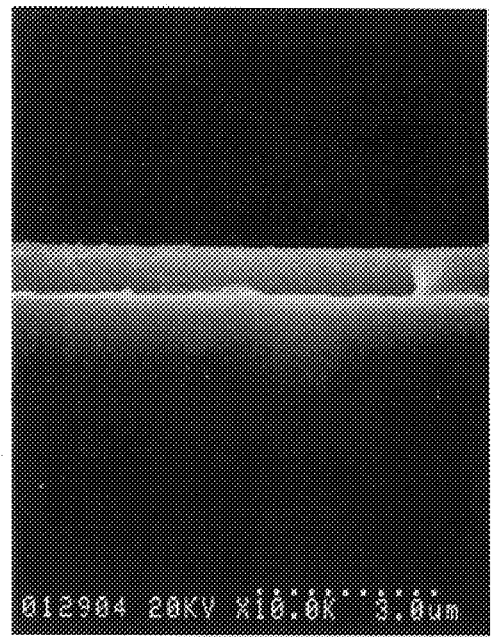

0.40 g of $LGa(SCOCH_3)_2Me$ (L=3,5-dimethyl pyridine) was dissolved in 20 mL pyridine forming a light orange clear solution. $T_{sub}$=270° C. to 310° C. $T_{furnace(preheating)}$=80° C., $T_{tape(preheating)}$=50° C. Deposition rate was about 15 nm/min at 310° C. substrate temperature. $N_2$ was used as carrier gas at 20 psi. XRD and SEM of the resulting $Ga_2S_3$ film are shown in FIGS. 24 and 25.

It is especially noteworthy that the present invention allows the CVD film deposition of such sulfides as CdS, ZnS, GaS, $In_2S_3$ at very low temperatures. Such low temperature depositions have never been reported before from single-source precursors.

In the above examples the formation of a mixed metal sulfide film of two different metals has been described.

However, more than two metal compound precursors can be used in accordance with the described procedures in order to form multi-metal sulfide films containing three, four or more different metals.

Annealing

The resulting films may be amorphous and may require an annealing step in order to convert such an intermediate amorphous film to the desired crystalline film. Such an annealing step is preferably carried out at temperatures at or below 700° C. and serves, on the one hand, to remove any volatile reaction products from the metal sulfide film and, on the other hand, to crystallize or complete crystallization of an intermediate metal sulfide film.

Doping

The (mixed) metal sulfide films may also be doped in order to create the desired luminescent properties of the film. Preferred doping metals are, for example, Cu, Ag, Au, Eu, Dy, Ho, Tb, Pr, Er, and Ce. They can be added individually or in combination in the form of volatile compounds to the precursor solution. The dopant level in the final product (metal sulfide film) should be less than 10% by weight, preferably approximately 5% or less.

The present invention is, of course, in no way restricted to the specific disclosure of the specification, examples and drawings, but also encompasses any modifications within the scope of the appended claims.

What we claim is:

1. A method of depositing a metal sulfide film on a substrate, said method comprising the steps of:
    preparing a solution containing at least one metal compound precursor comprising:
        a) at least one thiocarboxylate ligand SECR, wherein E is selected from the group consisting of O and S and wherein R is selected from the group consisting of alkyl, aryl, substituted alkyl, substituted aryl, halogenated alkyl, and halogenated aryl and
        b) at least one coordinated ligand L selected from the group consisting of monodentate ligands and multidentate ligands;
    heating the substrate to a reaction temperature;
    evaporating the solution to form vapors of said metal compound precursor; and
    contacting the vapors and the substrate heated to said reaction temperature, said reaction temperature sufficient to decompose said metal compound precursor to form said metal sulfide film of at least one metal M on the substrate.

2. A method according to claim 1, wherein the metal of said metal compound precursor is selected from the group consisting of Ca, Sr, Ba, Zn, Cd, Pb, Ga, In, Sb, and Bi.

3. A method according to claim 1, further comprising the step of producing an aerosol from the solution before the step of evaporating.

4. A method according to claim 1, wherein said metal compound precursor is $M(SECR)_nL_m$.

5. A method according to claim 1, further including the step of selecting the multidentate ligand from the group consisting of cyclic polyethers, acyclic polyethers, cyclic polyamines, and acyclic polyamines.

6. A method according to claim 5, wherein the acyclic polyethers include diglyme, triglyme, tetraglyme, and derivatives of diglyme, triglyme, and tetraglyme.

7. A method according to claim 5, wherein the polyamines include ethylene diamine and derivatives thereof and diethylene triamine and derivatives thereof.

8. A method according to claim 1, further including the step of selecting the multidentate ligand from the group of crown ethers.

9. A method according to claim 8, wherein the group of crown ethers includes 18-crown-6 ether and derivatives thereof and 15-crown-5 ether and derivatives thereof.

10. A method according to claim 1, further including the step of selecting the monodentate ligand from the group consisting of an ether and an amine.

11. A method according to claim 1, further comprising the step of annealing at a preset annealing temperature the metal sulfide film formed on the substrate.

12. A method according to claim 11, wherein said step of annealing includes a step of providing an inert atmosphere for the substrate and the metal sulfide film.

13. A method according to claim 11, wherein said step of annealing includes a step of selecting the preset annealing temperature to be below 700° C.

14. A method according to claim 11, wherein said step of annealing includes a step of selecting the preset annealing temperature to be identical to the reaction temperature.

15. A method according to claim 1, further including the steps of adding to the solution at least one dopant compound comprising a metal dopant selected from the group consisting of Cu, Ag, Au, Eu, Dy, Ho, Er, Tb, Pr, and Ce and selecting a concentration of said metal dopant to be less than 10 weight-% of the metal sulfide film.

16. A method according to claim 1, further including the step of selecting said reaction temperature to be between 85° C. and 600° C.

17. A method according to claim 1, further including the step of selecting a preheating temperature for the step of evaporating to be between 70° C. and 250° C.

18. A method according to claim 1, wherein said solution contains a first one of said metal compound precursors and a second one of said metal compound precursors to produce a mixed metal sulfide film, wherein said first metal compound precursor contains a different metal than said second metal compound precursor.

19. A method according to claim 18, wherein said solution contains a third one of said metal compound precursors and wherein said third metal compound precursor contains a different metal than said first and said second metal compound precursors.

20. A method according to claim 18, further including the steps of adding to the solution of said first and said second metal compound precursors at least one dopant compound comprising a metal dopant selected from the group consisting of Mn, Cu, Ag, Au, Eu, Dy, Ho, Er, Tb, Pr, and Ce and selecting a concentration of the metal dopant to be less than 10 weight-% of the mixed metal sulfide film.

21. A method according to claim 1, comprising the step of selecting the substrate from the group consisting of a silicon substrate, a glass substrate, an indium tin oxide substrate, and an aluminum tin oxide substrate.

22. A method according to claim 1, wherein said metal compound precursor is $(R^1O)_nM(SECR)_m$, wherein $R^1$ is alkyl, aryl, substituted alkyl and substituted aryl.

* * * * *

UNITED STATES PATENT AND TRADEMARK OFFICE
CERTIFICATE OF CORRECTION

PATENT NO. : 5,837,320
DATED : November 17, 1998
INVENTOR(S) : Hampden-Smith et al It is certified that error appears in the above-indentified patent and that said Letters Patent is hereby corrected as shown below:

Column 1, line 9, should read as follows:

N00014-94-1-0324 awarded by the Office of Navel Research.

Signed and Sealed this

Fourteenth Day of September, 1999

Attest:

Q. TODD DICKINSON

*Attesting Officer*   *Acting Commissioner of Patents and Trademarks*